US009755149B2

(12) United States Patent
Imai et al.

(10) Patent No.: US 9,755,149 B2
(45) Date of Patent: Sep. 5, 2017

(54) ORGANIC EL DISPLAY UNIT, METHOD OF MANUFACTURING THE SAME, INK, AND ELECTRONIC APPARATUS

(71) Applicant: JOLED Inc., Tokyo (JP)

(72) Inventors: Toshiaki Imai, Kanagawa (JP); Tadahiko Yoshinaga, Kanagawa (JP)

(73) Assignee: JOLED Inc., Tokyo (JP)

( * ) Notice: Subject to any disclaimer, the term of this patent is extended or adjusted under 35 U.S.C. 154(b) by 12 days.

(21) Appl. No.: 14/431,984

(22) PCT Filed: Sep. 19, 2013

(86) PCT No.: PCT/JP2013/075279
§ 371 (c)(1),
(2) Date: Mar. 27, 2015

(87) PCT Pub. No.: WO2014/057782
PCT Pub. Date: Apr. 17, 2014

(65) Prior Publication Data
US 2015/0287926 A1    Oct. 8, 2015

(30) Foreign Application Priority Data
Oct. 11, 2012  (JP) .................. 2012-225750

(51) Int. Cl.
*H01L 51/00*  (2006.01)
*H01L 51/50*  (2006.01)
(Continued)

(52) U.S. Cl.
CPC ........ *H01L 51/0035* (2013.01); *C09D 11/037* (2013.01); *C09D 11/106* (2013.01);
(Continued)

(58) Field of Classification Search
CPC ............ H01L 51/5012; H01L 51/0059; H01L 27/3211; H01L 51/5016; H01L 51/0043;
(Continued)

(56) References Cited
U.S. PATENT DOCUMENTS 6,670,772 B1 *  12/2003  Arnold ................ H01L 27/3258
                                                313/504
8,253,115 B1 *   8/2012  Stevens ................ C09K 11/06
                                                250/458.1
(Continued)

FOREIGN PATENT DOCUMENTS

JP    2003-151775 A    5/2003
JP    2004-186111 A    7/2004
(Continued)

OTHER PUBLICATIONS

Japanese Office Action issued Mar. 14, 2017, for JP2014-540790.

*Primary Examiner* — Jaehwan Oh
(74) *Attorney, Agent, or Firm* — Michael Best & Friedrich LLP

(57) ABSTRACT

An organic EL display unit includes a first organic EL device including a first light-emitting layer that emits first color light and a second organic EL device including a second light-emitting layer that emits second color light of a shorter wavelength than the first color light. The first light-emitting layer includes, as a host material, a polymer material that does not emit the first color light or does not mainly emit the first color light, and includes, as a dopant, a low-molecular-weight material or a polymer material that emits the first color light.

12 Claims, 15 Drawing Sheets

(51) Int. Cl.
*C09D 11/52* (2014.01)
*C09K 11/06* (2006.01)
*H01L 27/32* (2006.01)
*C09D 11/037* (2014.01)
*C09D 11/106* (2014.01)
*H01L 51/56* (2006.01)

(52) U.S. Cl.
CPC .............. *C09D 11/52* (2013.01); *C09K 11/06* (2013.01); *H01L 27/3206* (2013.01); *H01L 27/3211* (2013.01); *H01L 51/5036* (2013.01); *C09K 2211/1416* (2013.01); *C09K 2211/1466* (2013.01); *C09K 2211/1483* (2013.01); *C09K 2211/185* (2013.01); *H01L 51/0002* (2013.01); *H01L 51/003* (2013.01); *H01L 51/0024* (2013.01); *H01L 51/0085* (2013.01); *H01L 51/5012* (2013.01); *H01L 51/5016* (2013.01); *H01L 51/5024* (2013.01); *H01L 51/56* (2013.01); *H01L 2227/323* (2013.01)

(58) Field of Classification Search
CPC ............. H01L 51/0039; H01L 51/0035; H01L 51/0037; H01L 27/3209; H01L 2924/12044; H01L 2251/552
See application file for complete search history.

(56) References Cited

U.S. PATENT DOCUMENTS

| | | | |
|---|---|---|---|
| 2003/0082404 A1 | 5/2003 | Sotoyama et al. | |
| 2004/0036421 A1* | 2/2004 | Arnold | G09G 3/3216 315/169.3 |
| 2004/0094768 A1* | 5/2004 | Yu | H01L 27/3211 257/79 |
| 2005/0057150 A1* | 3/2005 | Kim | H01L 27/3211 313/504 |
| 2005/0173700 A1* | 8/2005 | Liao | H01L 27/3211 257/40 |
| 2005/0212728 A1* | 9/2005 | Miller | G09G 3/2003 345/76 |
| 2005/0225232 A1* | 10/2005 | Boroson | H01L 51/526 313/504 |
| 2005/0236981 A1* | 10/2005 | Cok | H01L 27/3213 313/504 |
| 2006/0006792 A1* | 1/2006 | Strip | H01L 27/3209 313/500 |
| 2006/0105201 A1* | 5/2006 | Lee | H01L 27/3211 428/690 |
| 2006/0214596 A1* | 9/2006 | Miller | G09G 3/3233 315/169.3 |
| 2006/0244370 A1* | 11/2006 | Tyan | H01L 51/5278 313/506 |
| 2006/0269782 A1* | 11/2006 | Liao | H01L 51/0052 428/690 |
| 2007/0096640 A1* | 5/2007 | Yu | H01L 27/3211 313/504 |
| 2007/0178331 A1* | 8/2007 | Park | H01L 51/0084 428/690 |
| 2007/0200124 A1* | 8/2007 | Suzuri | C09K 11/06 257/89 |
| 2007/0200492 A1* | 8/2007 | Cok | H01L 27/322 313/506 |
| 2008/0108270 A1* | 5/2008 | Hama | H01L 27/3209 445/24 |
| 2008/0157663 A1* | 7/2008 | Sung | H01L 51/5234 313/504 |
| 2010/0045171 A1* | 2/2010 | Katakura | C09K 11/06 313/504 |
| 2010/0148662 A1* | 6/2010 | Lee | C07D 241/46 313/504 |
| 2011/0108819 A1* | 5/2011 | Kathirgamanathan | C07D 263/57 257/40 |
| 2012/0097933 A1 | 4/2012 | Ando | |
| 2012/0098002 A1* | 4/2012 | Song | H01L 51/5028 257/98 |
| 2013/0240842 A1* | 9/2013 | Rinzler | H01L 51/057 257/40 |
| 2013/0303776 A1* | 11/2013 | Okamoto | C09K 11/06 548/103 |
| 2013/0303777 A1* | 11/2013 | Okamoto | C07F 15/002 548/103 |

FOREIGN PATENT DOCUMENTS

| | | |
|---|---|---|
| JP | 2006-216563 A | 8/2006 |
| JP | 2008-112875 A | 5/2008 |
| JP | 2011-108531 A | 6/2011 |
| JP | 2012-079631 A | 4/2012 |
| WO | 2007/060854 A1 | 5/2007 |

\* cited by examiner

[ FIG. 1 ]
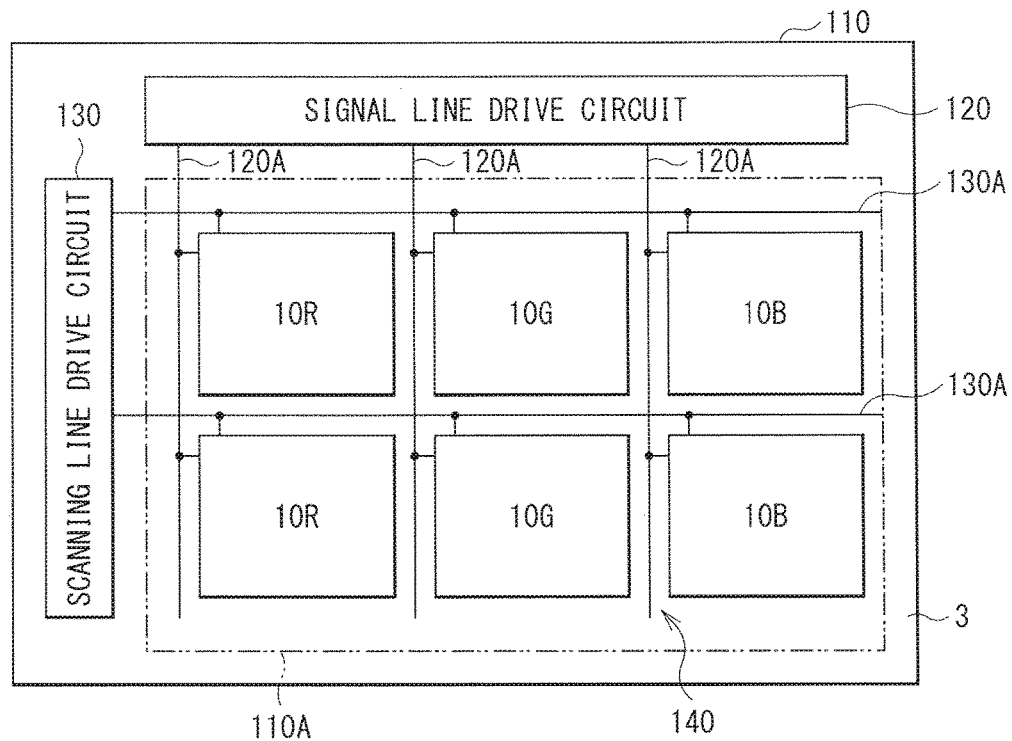
[ FIG. 2 ]
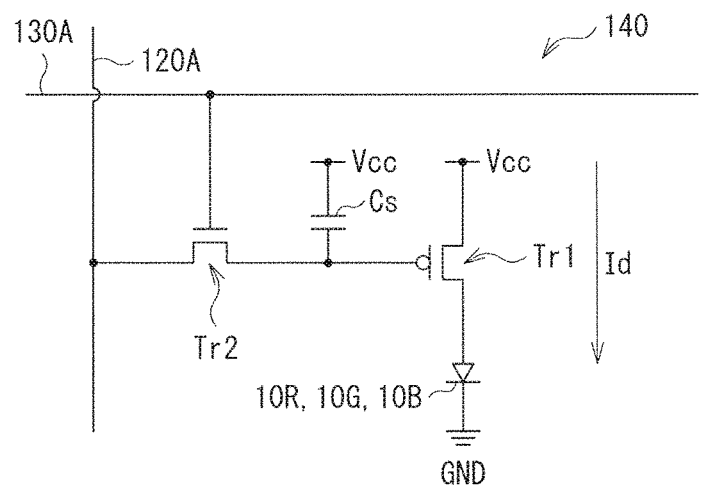

[ FIG. 3 ]
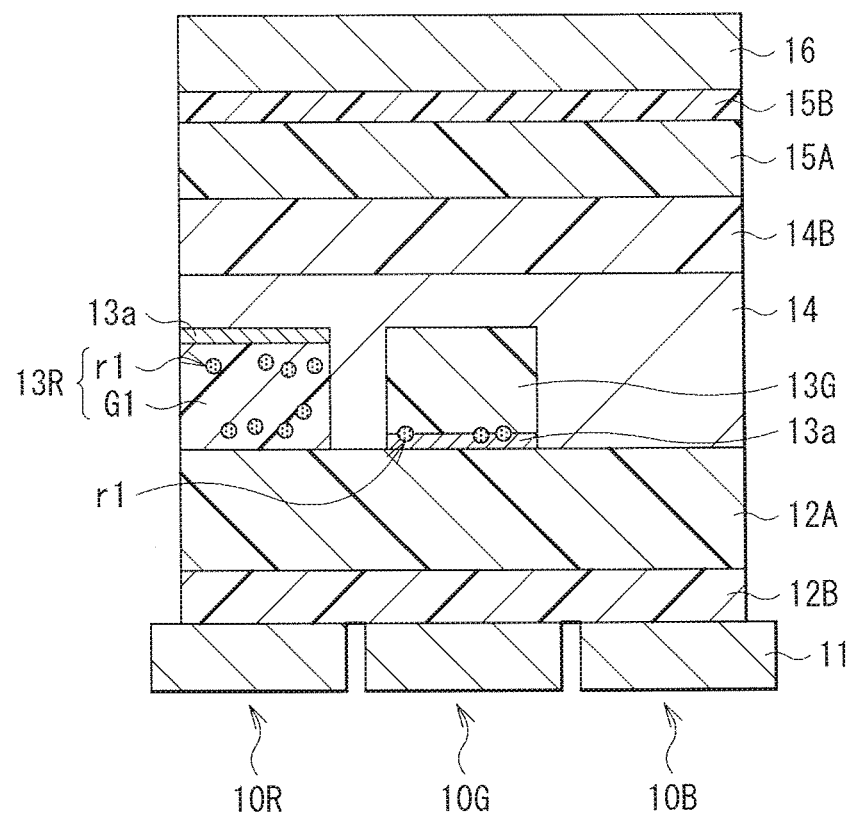

[ FIG. 4 ]
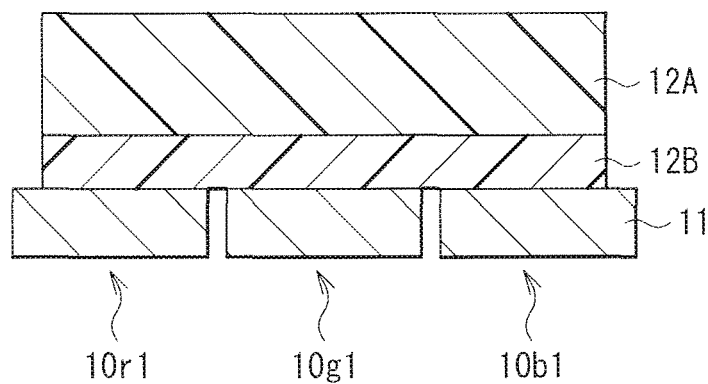
[ FIG. 5A ]
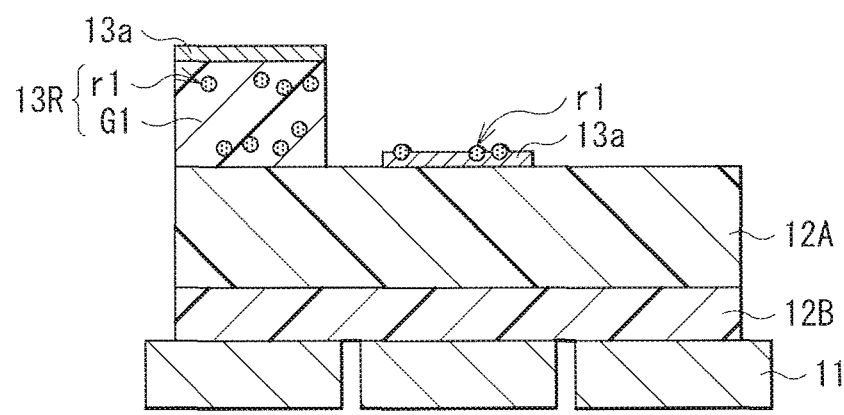
[ FIG. 5B ]
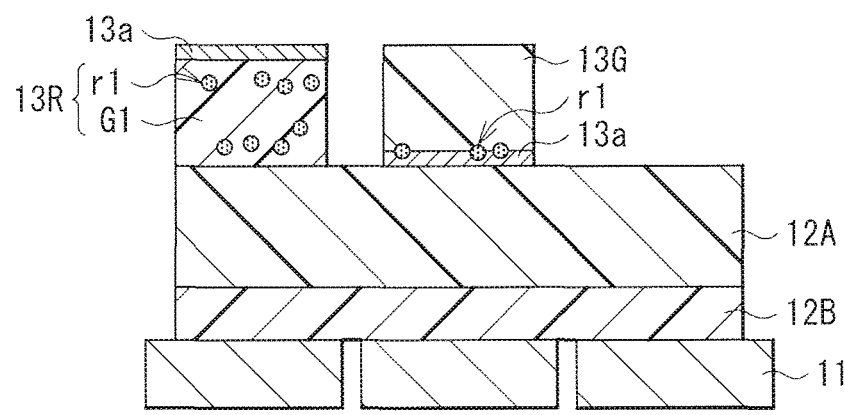

[ FIG. 6A ]
<BLANKET COATING PROCESS>
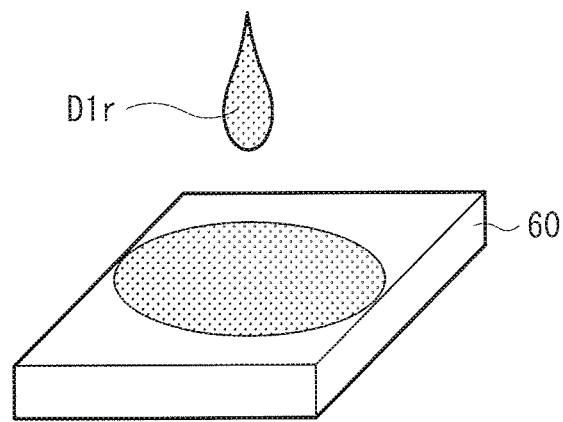
[ FIG. 6B ]
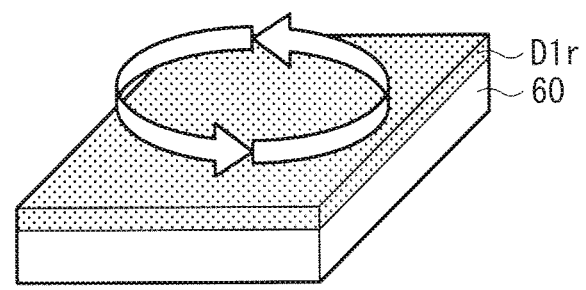

[FIG. 7A]
<PRINTING PATTERN FORMATION PROCESS>
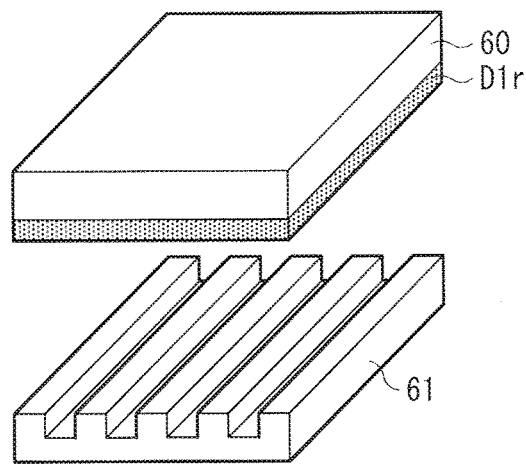
[FIG. 7B]
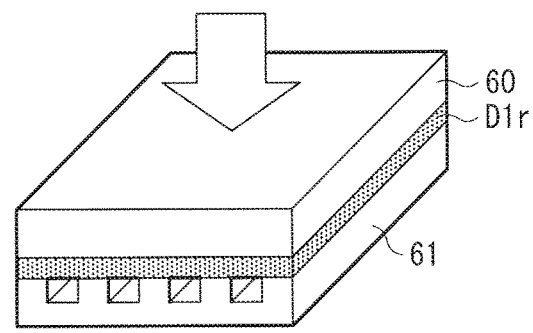
[FIG. 7C]
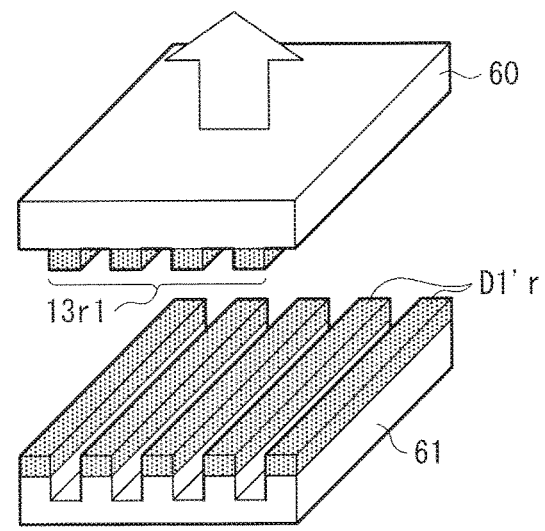

[ FIG. 8A ]
<TRANSFER PROCESS>
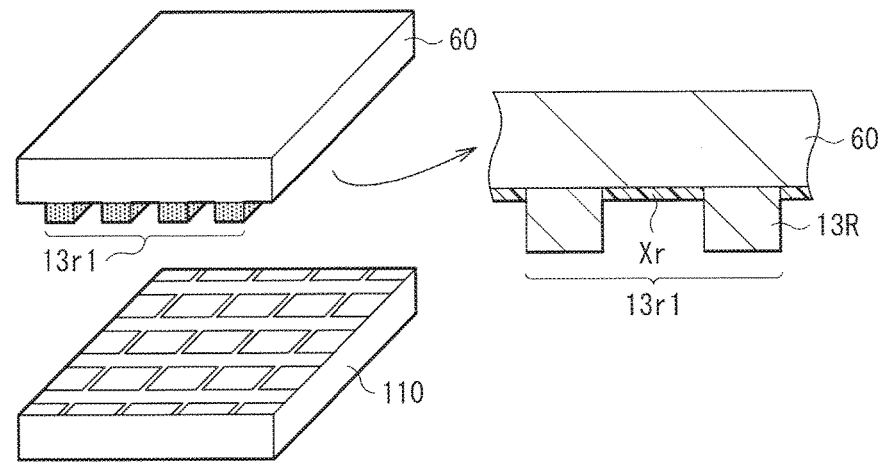
[ FIG. 8B ]
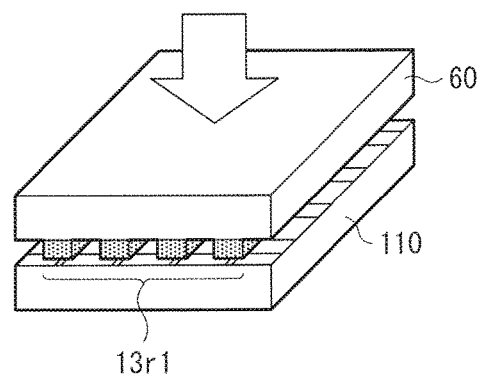
[ FIG. 8C ]
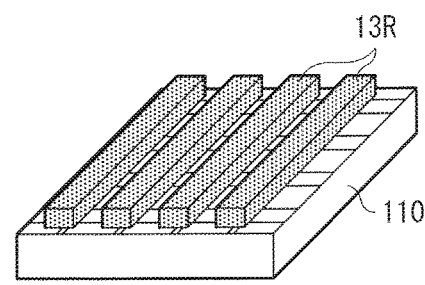

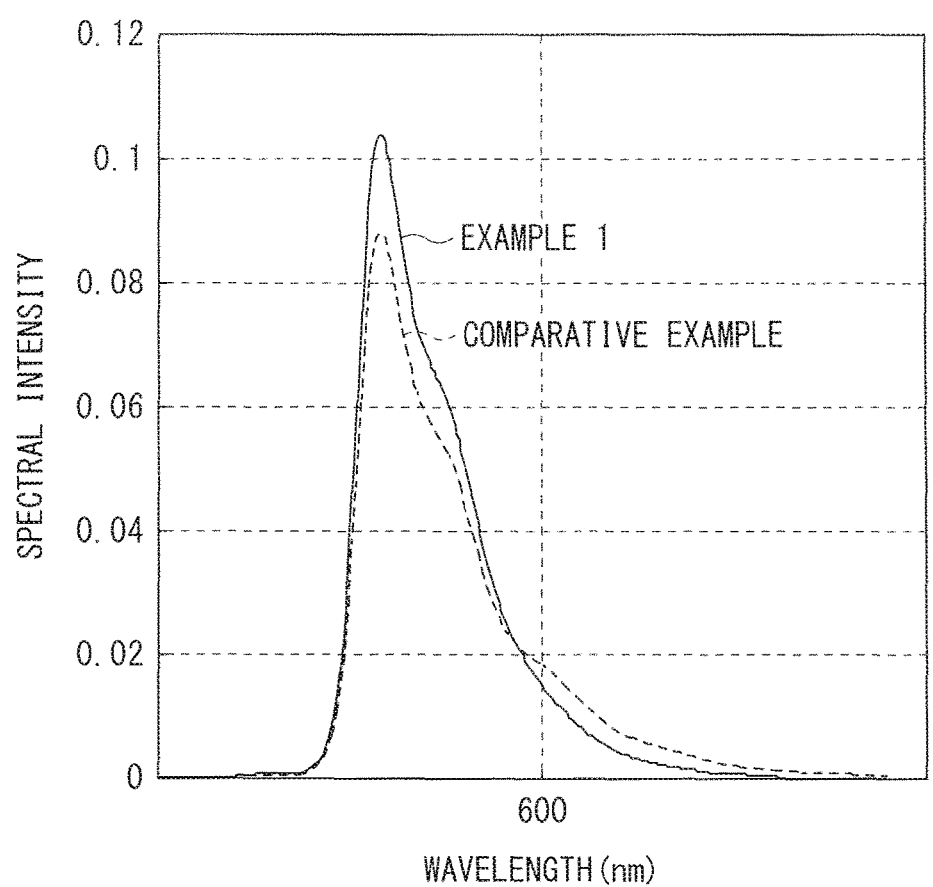
[ FIG. 9 ]

[ FIG. 10 ]
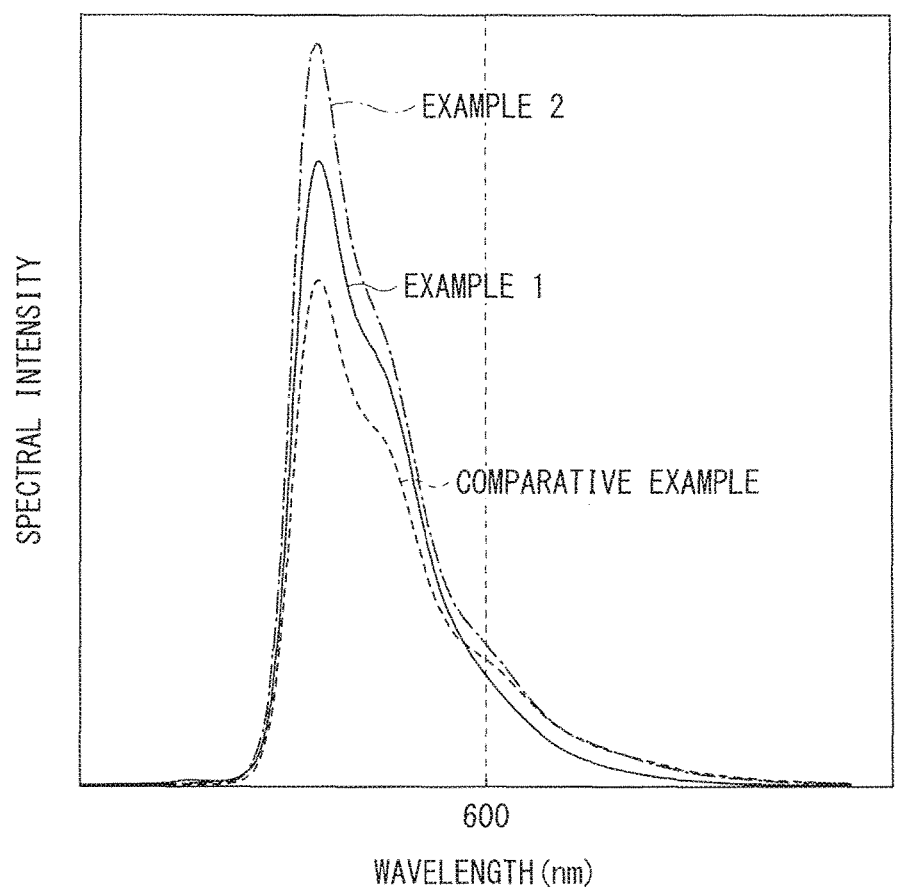

[ FIG. 11 ]
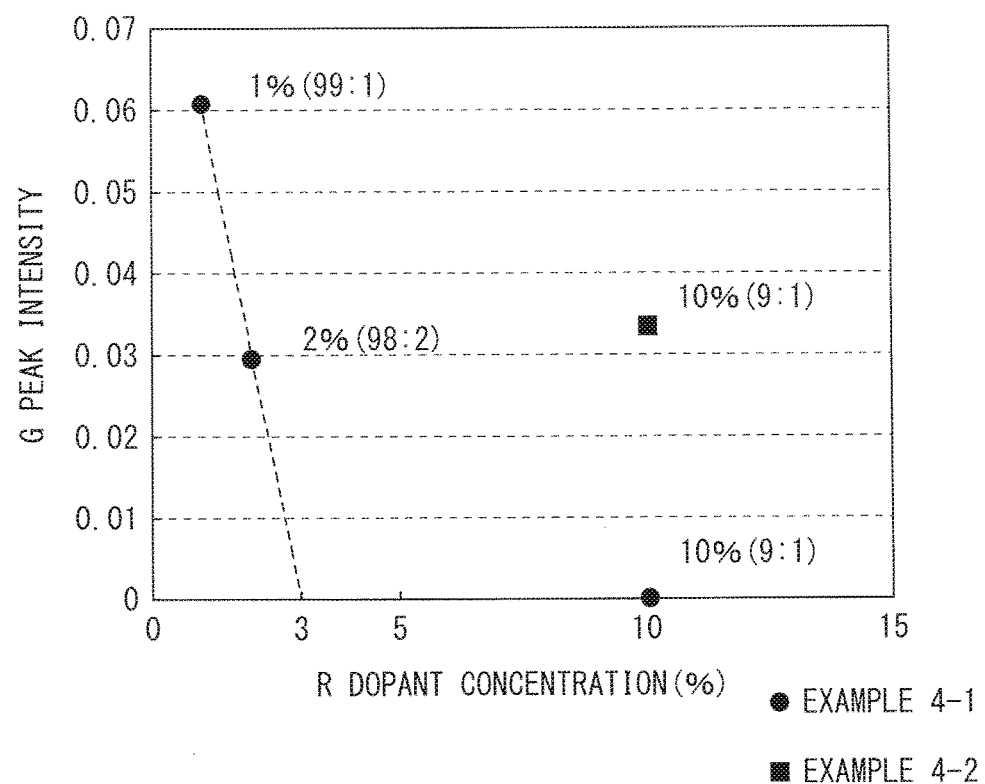

[ FIG. 12 ]
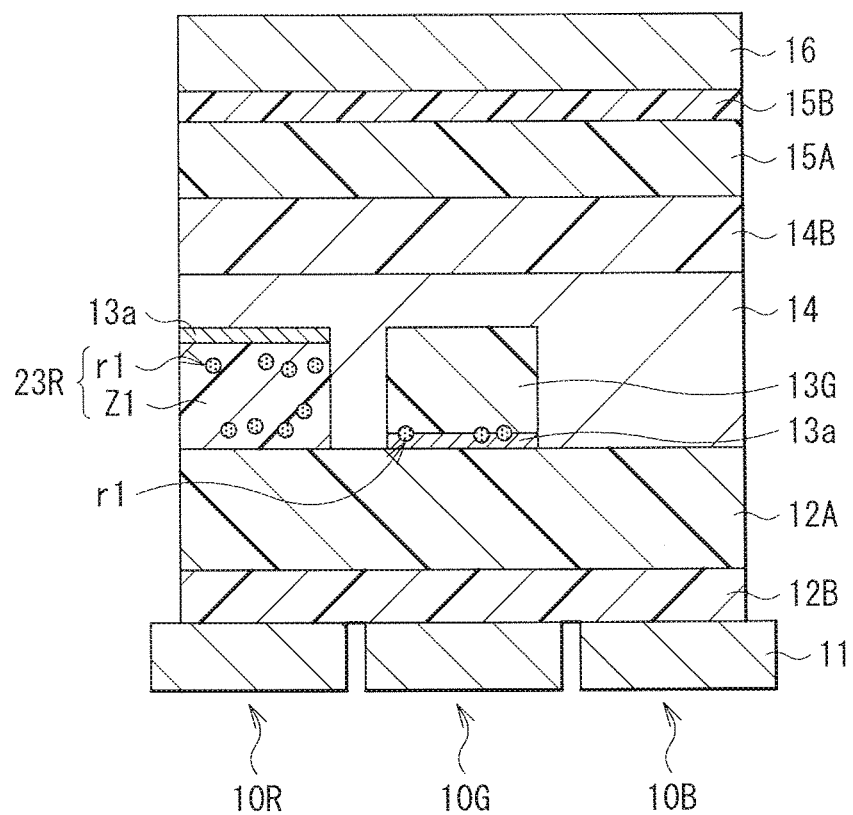

[ FIG. 13A ]
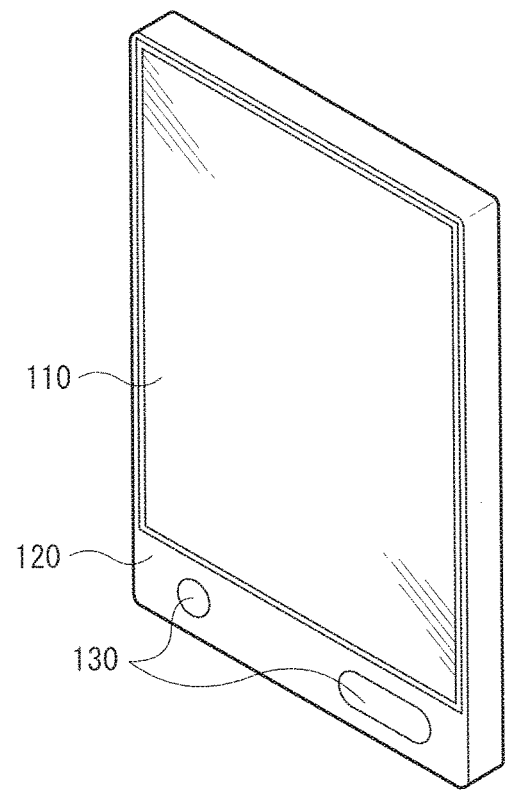
[ FIG. 13B ]
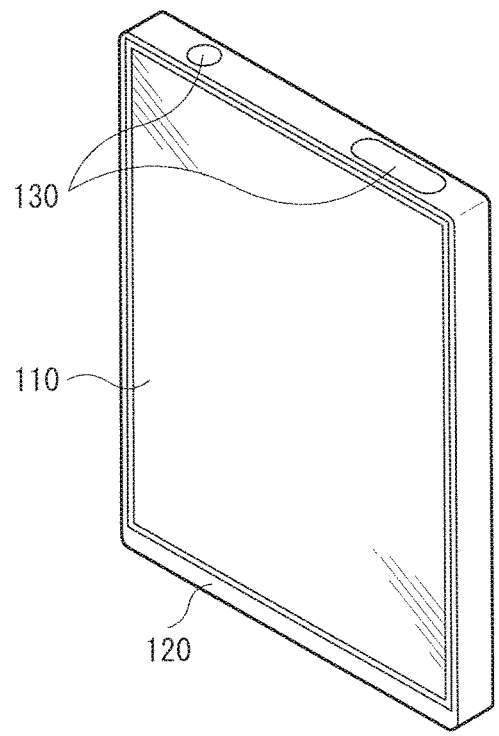

[ FIG. 14 ]
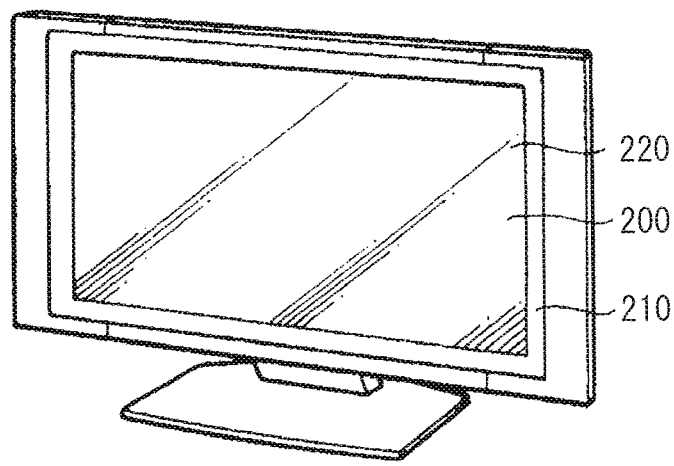
[ FIG. 15A ]
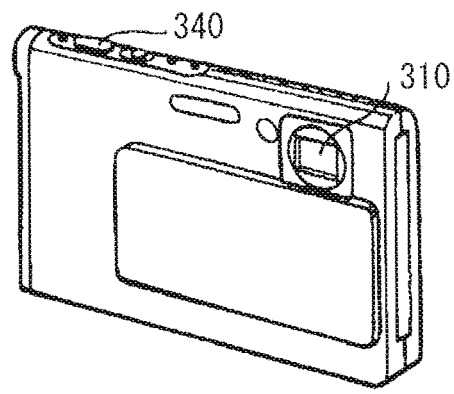
[ FIG. 15B ]
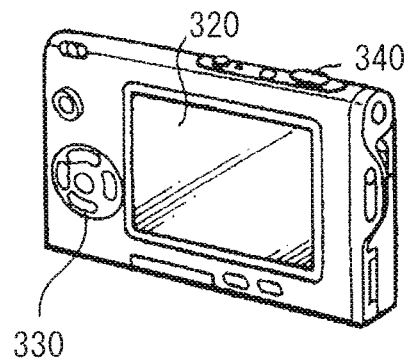

[ FIG. 16 ]
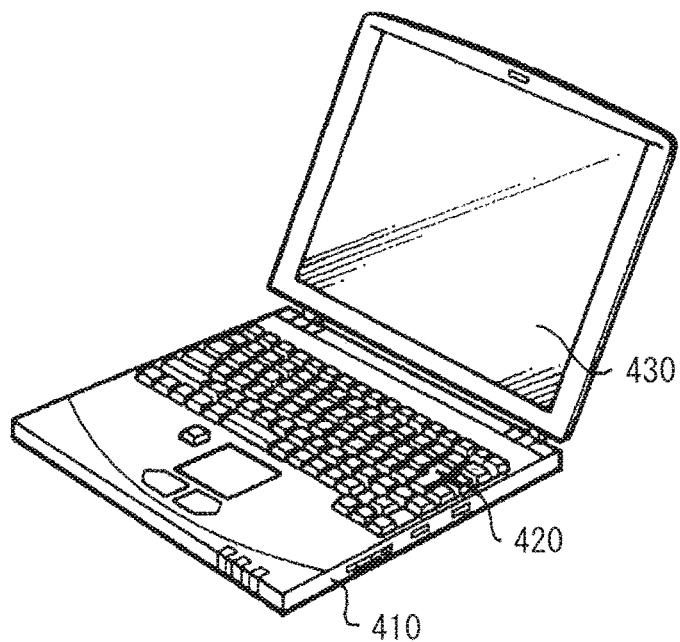
[ FIG. 17 ]
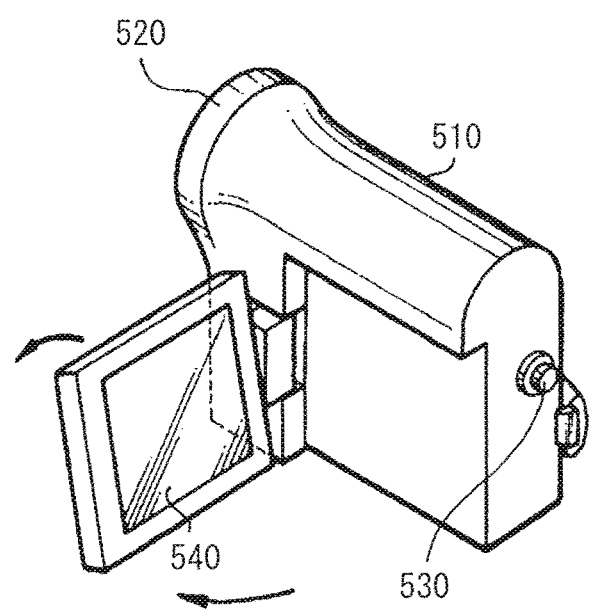

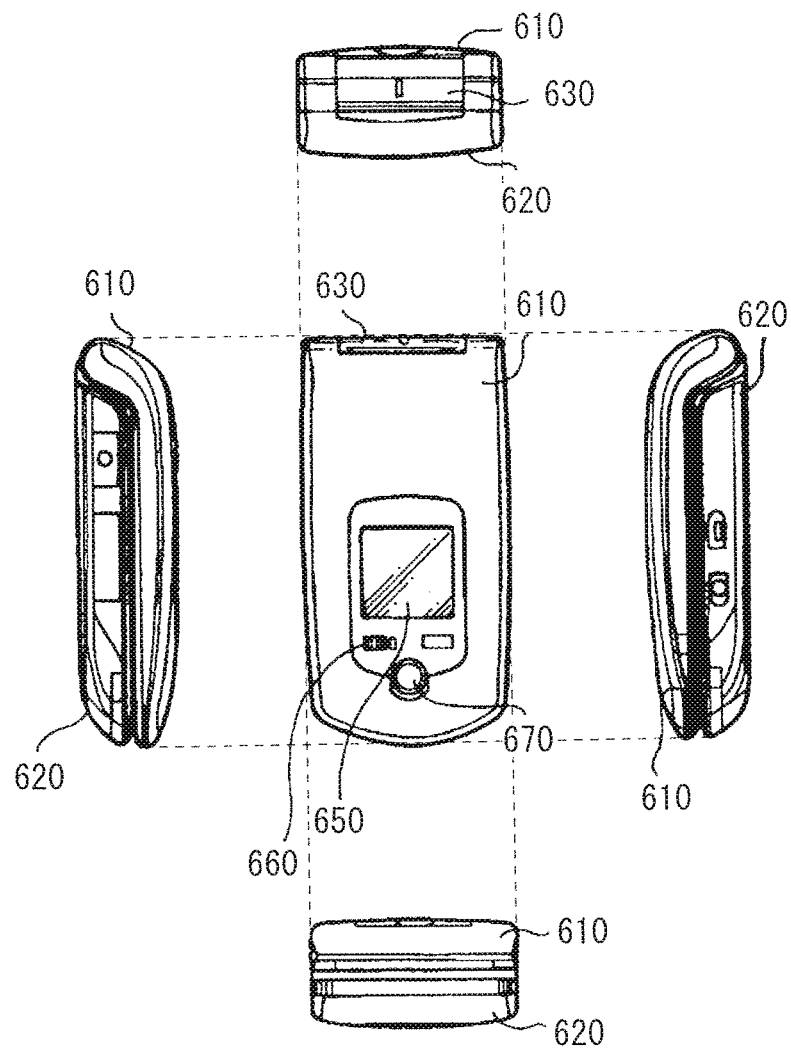
[ FIG. 18A ]

[ FIG. 18B ]
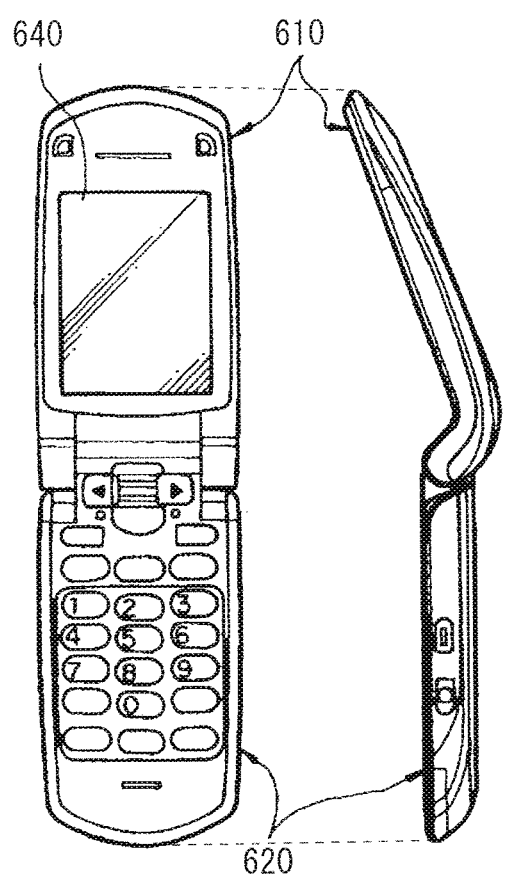

ORGANIC EL DISPLAY UNIT, METHOD OF MANUFACTURING THE SAME, INK, AND ELECTRONIC APPARATUS

TECHNICAL FIELD

The present disclosure relates to an organic EL display unit that emits light with use of an organic electroluminescence (EL) phenomenon, a method of manufacturing the same, an ink, and an electronic apparatus.

BACKGROUND ART

As development of information and communications industry has been accelerated, display devices having high performance have been demanded. In particular, organic EL devices that have attracted attention as next-generation display devices have advantages, as self-luminous type display devices, of not only a wide viewing angle and excellent contrast but also fast response speed.

Organic films configuring a light-emitting layer and the like in the organic EL devices are broadly classified into a low-molecular-weight material and a polymer material, and as a method of forming these organic films, in a case where the low-molecular-weight material is used, dry methods such as a vacuum evaporation method are adopted. On the other hand, in a case where the polymer material is used, wet methods (coating methods) such as spin coating, ink jet printing, nozzle coating, relief printing, reverse offset printing, and laser transfer are adopted.

In the above-described wet methods, as the laser transfer that is a contact transfer system, for example, a technique using a donor film with recessions and protrusions is disclosed (refer to PTL 1). However, in this transfer system, an organic film is formed on the recessions and protrusions of the donor film; therefore, it is difficult to secure uniformity in a film thickness of the organic film.

On the other hand, for example, reverse offset printing as described in PTL 2 have attracted attention, because in the reverse offset printing, film formation accuracy is high and high-definition printing is possible by coating a blanket for transfer with an organic film with a uniform film thickness.

CITATION LIST

Patent Literature

PTL 1: Japanese Unexamined Patent Application Publication No. 2006-216563
PTL 2: Japanese Unexamined Patent Application Publication No. 2004-186111

SUMMARY OF INVENTION

For example, in reverse offset printing of the above-described film formation techniques, a pattern for transfer is formed on a blanket with use of a plate. Therefore, in a case where light-emitting layers of different colors are pattern-formed for respective pixels, the following issue arises. Namely, a dye remains in an area where the dye has been taken off by the plate on a surface of the blanket, and the remaining dye is adhered to a non-pattern region (an adjacent pixel or the like). This remaining dye causes color mixture or degradation in light emission efficiency, thereby resulting in degradation in display quality.

Therefore, it is desirable to provide an organic EL display unit capable of improving display quality by suppressing color mixture when a plurality of light-emitting layers that emit color light of different wavelengths are pattern-formed, a method of manufacturing the same, an ink, and an electronic apparatus.

An organic EL display unit according to an embodiment of the present disclosure includes: a first organic EL device and a second organic EL device, the first organic EL device including a first light-emitting layer that emits first color light, and the second organic EL device including a second light-emitting layer that emits second color light of a shorter wavelength than the first color light, in which the first light-emitting layer includes, as a host material, a polymer material that does not emit the first color light or does not mainly emit the first color light, and includes, as a dopant, a low-molecular-weight material or a polymer material that emits the first color light.

It is to be noted that the low-molecular-weight material may be desirably, for example, a monomer with a weight-average molecular weight of 50000 or less.

In the organic EL display unit according to the embodiment of the present disclosure, the first light-emitting layer includes, as the host material, the polymer material that does not emit the first color light or does not mainly emit the first color light, and includes, as the dopant, the low-molecular-weight material or the polymer material that emits the first color light. Therefore, for example, in a case where the first light-emitting layer is formed by reverse offset printing, in the second organic EL device, mixture of the first color light and the second color light is suppressed.

A method of manufacturing an organic EL display unit according to an embodiment of the present disclosure, the organic EL display unit including a first organic EL device and a second organic EL device, the first organic EL device including a first light-emitting layer that emits first color light, and the second organic EL device including a second light-emitting layer that emits second color light of a shorter wavelength than the first color light, the method includes: forming the first light-emitting layer using a polymer material as a host material and a low-molecular-weight material or a polymer material as a dopant, the polymer material that does not emit the first color light or does not mainly emit the first color light, and the low-molecular-weight material or the polymer material that emits the first color light.

In the method of manufacturing the organic EL display unit according to the embodiment of the present disclosure, when the first light-emitting layer is formed, the polymer material that does not emit the first color light or does not mainly emit the first color light is used as the host material, and the low-molecular-weight material or the polymer material that emits the first color light is used as the dopant. Therefore, for example, in a case where the first light-emitting layer is formed by reverse offset printing, an organic EL display unit in which mixture of the first color light and the second color light is suppressed in the second organic EL device is allowed to be manufactured.

An ink according to an embodiment of the present disclosure used to form a first light-emitting layer of an organic EL display unit, the organic EL display unit including a first organic EL device and a second organic EL device, the first organic EL device including the first light-emitting layer that emits first color light, and the second organic EL device including a second light-emitting layer that emits second color light of a shorter wavelength than the first color light, the ink includes: a polymer material that does not emit the first color light or does not mainly emit the first color light as a host material and a low-molecular-weight material or a polymer material that emits the first color light as a dopant.

An electronic apparatus according to an embodiment of the present disclosure includes the above-described organic EL display unit according to the embodiment of the present disclosure.

According to the organic EL display unit and the method of manufacturing the same, and the electronic apparatus of the embodiments of the present disclosure, the first light-emitting layer includes, as the host material, the polymer material that does not emit the first color light or does not mainly emit the first color light, and includes, as the dopant, the low-molecular-weight material or the polymer material that emits the first color light. Therefore, for example, in a case where the first light-emitting layer is formed by reverse offset printing, in the second organic EL device, mixture of the first color light and the second color light are allowed to be suppressed. Accordingly, in a case where a plurality of light-emitting layers that emit color light of different wavelengths are pattern-formed, color mixture is allowed to be suppressed, thereby improving display quality.

According to the ink of the embodiment of the present disclosure, the polymer material that does not emit the first color light or does not mainly emit the first color light is included as the host material, and the low-molecular-weight material or the polymer material that emits the first color light is included as the dopant; therefore, in a case where the first light-emitting layer is formed with use of the ink, in the second organic EL device, mixture of the first color light and the second color light is allowed to be suppressed. Therefore, when a plurality of light-emitting layers that emit color light of different wavelengths are pattern-formed, color mixture is allowed to be suppressed, thereby improving display quality.

BRIEF DESCRIPTION OF DRAWINGS

FIG. 1 is a diagram illustrating an entire configuration of an organic EL display unit according to a first embodiment of the present disclosure.

FIG. 2 is a diagram illustrating an example of a pixel drive circuit illustrated in FIG. 1.

FIG. 3 is a sectional view illustrating a configuration of the organic EL display unit illustrated in FIG. 1.

FIG. 4 is a sectional view illustrating a method of manufacturing the organic EL display unit illustrated in FIG. 1 in process order.

FIG. 5A is a sectional view illustrating a process following FIG. 4.

FIG. 5B is a sectional view illustrating a process following FIG. 5A.

FIG. 6A is a schematic view for describing the process illustrated in FIG. 5A.

FIG. 6B is a sectional view illustrating a process following FIG. 6A.

FIG. 7A is a sectional view illustrating a process following FIG. 6B.

FIG. 7B is a sectional view illustrating a process following FIG. 7A.

FIG. 7C is a sectional view illustrating a process following FIG. 7B.

FIG. 8A is a sectional view illustrating a process following FIG. 7C.

FIG. 8B is a sectional view illustrating a process following FIG. 8A.

FIG. 8C is a sectional view illustrating a process following FIG. 8B.

FIG. 9 is a characteristic diagram illustrating G light emission intensity of an example and a comparative example.

FIG. 10 is a characteristic diagram illustrating G light emission intensity of examples and the comparative example.

FIG. 11 is a characteristic diagram illustrating a relationship between a ratio of an R dopant to a polymer light-emitting material G1 and G light emission intensity.

FIG. 12 is a sectional view illustrating a configuration of an organic EL display unit according to a second embodiment of the present disclosure.

FIG. 13A is a perspective view illustrating an appearance of Application Example 1 of the organic EL display units of the above-described embodiments.

FIG. 13B is a perspective view illustrating an appearance of Application Example 1 of the organic EL display units of the above-described embodiments.

FIG. 14 is a perspective view illustrating an appearance of Application Example 2 of the organic EL display units of the above-described embodiments.

FIG. 15A is a perspective view illustrating an appearance viewed from a front side of Application Example 3.

FIG. 15B is a perspective view illustrating an appearance viewed from a back side of Application Example 3.

FIG. 16 is a perspective view illustrating an appearance of Application Example 4.

FIG. 17 is a perspective view illustrating an appearance of Application Example 5.

FIG. 18A is a front view, a left side view, a right side view, a top view, and a bottom view in a state in which Application Example 6 is closed.

FIG. 18B is a front view and a side view in a state in which Application Example 6 is opened.

DESCRIPTION OF EMBODIMENTS

Some embodiments of the present disclosure will be described in detail below referring to the accompanying drawings in the following order.

1. First Embodiment (An example of an organic EL display unit in which a red light-emitting layer (an R low-molecular-weight material and a polymer light-emitting material G1) and a green light-emitting layer are formed by reverse offset printing and a blue light-emitting layer is formed by a vacuum evaporation method)

2. Second Embodiment (An example of an organic EL display unit in which the red light-emitting layer (the R low-molecular-weight material and a thickener) and the green light-emitting layer are formed by reverse offset printing and the blue light-emitting layer is formed by a vacuum evaporation method)

3. Application Examples 1 to 6 (Examples of an electronic apparatus)

First Embodiment

FIG. 1 illustrates a configuration of an organic EL display unit according to a first embodiment of the present disclosure. This organic EL display unit is used as an organic EL television or the like, and may be configured, for example, by arranging a plurality of organic EL devices 10R, a plurality of organic EL devices 10G, and a plurality of organic EL devices 10B that will be described later in a matrix as a display region 110A on a substrate 110. A signal line drive circuit 120 and a scanning line drive circuit 130 as drivers for image display are provided around the display region 110A.

A pixel drive circuit 140 is provided in the display region 110A. FIG. 2 illustrates an example of the pixel drive circuit 140. The pixel drive circuit 140 is an active drive circuit formed below a lower electrode 11 that will be described later. In other words, the pixel drive circuit 140 includes a driving transistor Tr1, a writing transistor Tr2, a capacitor (a retention capacitor) Cs located between these transistors Tr1 and Tr2, and the organic EL device 10R (or the organic EL device 10G or the organic EL device 10B) connected in series to the driving transistor Tr1 between a first power supply line (Vcc) and a second power supply line (GND). Each of the driving transistor Tr1 and the writing transistor Tr2 is configured of a typical thin film transistor (TFT), and may have, for example, an inverted stagger configuration (a so-called bottom gate type) or a stagger configuration (a top gate type).

In the pixel drive circuit 140, a plurality of signal lines 120A are arranged along a column direction, and a plurality of scanning lines 130A are arranged along a row direction. An intersection of each signal line 120A and each scanning line 130A corresponds to one of the organic EL devices 10R, 10G, and 10B (sub-pixels). Each of the signal lines 120A is connected to the signal line drive circuit 120, and an image signal is supplied from the signal line drive circuit 120 to a source electrode of the writing transistor Tr2 through the signal line 120A. Each of the scanning lines 130A is connected to the scanning line drive circuit 130, and a scanning signal is sequentially supplied from the scanning line drive circuit 130 to a gate electrode of the writing transistor Tr2 through the scanning line 130.

Moreover, in the display region 110, the organic EL devices 10R (first organic EL devices) that generate red light, the organic EL devices 10G (second organic EL devices) that generate green light, and the organic EL devices 10B that generate blue light are arranged in a matrix as a whole. A combination of adjacent organic EL devices 10R, 10G, and 10B configures one pixel.

FIG. 3 illustrates a sectional configuration of the organic EL display unit illustrated in FIG. 1. In each of the organic EL devices 10R, 10G, and 10B, the lower electrode 11 as an anode, a hole injection layer (HIL) 12B, and a hole transport layer (HTL) 12A are laminated in this order from the substrate 110 (not illustrated in FIG. 3) side. In the organic EL device 10R, a red light-emitting layer 13R (a first light-emitting layer) is pattern-formed on the hole transport layer 12A, and in the organic EL device 10G, a green light-emitting layer 13G (a second light-emitting layer) is pattern-formed on the hole transport layer 12A. A connection layer (HCL) 14 is so formed as to cover the hole transport layer 12A, the red light-emitting layer 13R, and the green light-emitting layer 13G, and a blue light-emitting layer 14B, an electron transport layer 15A, an electron injection layer 15B, and an upper electrode 16 as a cathode are laminated in this order on the connection layer 14. As will be described in detail later, in this embodiment, the red light-emitting layer 13R and the green light-emitting layer 13G may be pattern-formed by, for example, reverse offset printing, and the blue light-emitting layer 14B may be formed by, for example, a vacuum evaporation method. In other words, the red light-emitting layer 13R and the green light-emitting layer 13G of organic layers located between the lower electrode 11 and the upper electrode 16 are provided for each device region (each pixel), and other layers are provided as common layers for respective device regions.

It is to be noted that, although not illustrated, these organic EL devices 10R, 10G, and 10B are coated with a protective layer, and a sealing substrate made of glass or the like is further bonded onto the protective layer with an adhesive layer made of a thermosetting resin, an ultraviolet curable resin, or the like in between to seal the organic EL devices 10R, 10G, and 10B.

The substrate 110 is a supporting body with one main surface on which the organic EL devices 10R, 10G, and 10B are formed in an array, and may be a publicly known substrate, and, for example, quartz, glass, metal foil, a film or a sheet made of a resin, or the like may be used. In particular, quartz and glass may be preferable, and in a case of a substrate made of a resin, as a material of the substrate, methacrylate resins typified by poly(methyl methacrylate) (PMMA), kinds of polyester such as polyethylene terephthalate (PET), polyethylene naphthalate (PEN), and polybutylene naphthalate (PBN), a polycarbonate resin, and the like may be adopted; however, a laminate configuration or execution of surface treatment that suppresses water permeability and gas permeability is necessary.

The lower electrode 11 is provided for each of the organic EL devices 10R, 10G, and 10B (for each pixel). For example, the lower electrode 11 may have a thickness in a laminate direction (hereinafter simply referred to as "thickness") of 10 nm to 1000 nm both inclusive, and may include a simple substance or an alloy of a metal element such as chromium (Cr), gold (Au), platinum (Pt), nickel (Ni), copper (Cu), tungsten (W) or silver (Ag). Moreover, the lower electrode 11 may have a laminate configuration of a metal film made of the simple substance or the alloy of the metal element and a transparent conductive film made of an oxide of indium and tin (ITO), InZnO (indium zinc oxide), an alloy of zinc oxide (ZnO) and aluminum (Al), or the like. It is to be noted that, in a case where the lower electrode 11 is used as an anode, the lower electrode 11 may be desirably made of a material with a high hole injection property. However, even a material, such as an aluminum (Al) alloy, in which a hole injection barrier caused by the presence of an oxide film on a surface thereof or a small work function is an issue is allowed to be used as the lower electrode 11 by providing an appropriate hole injection layer.

The hole injection layer 12B is configured to enhance hole injection efficiency to each of the light-emitting layers (the red light-emitting layer 13R, the green light-emitting layer 13G, and the blue light-emitting layer 14B), and is a buffer layer configured to prevent leakage. A material of the hole injection layer 12B may be appropriately selected in relation to a material of an electrode or an adjacent layer, and examples of the material of the hole injection layer 12B may include polyaniline, polythiophene, polypyrrole, polyphenylene vinylene, polythienylene vinylene, polyquinoline, polyquinoxaline, and derivatives thereof, a conductive polymer such as a polymer including an aromatic amine structure in a main chain or a side chain, metal phthalocyanine (such as copper phthalocyanine), and carbon.

In a case where the material used for the hole injection layer 12B is a polymer material, a weight-average molecular weight (Mw) of the polymer material may be within a range of 10000 to 300000 both inclusive, and may be preferably within a range of about 5000 to about 200000 both inclusive. Moreover, an oligomer with a weight-average molecular weight of about 2000 to about 10000 both inclusive may be used; however, in a case where the Mw is less than 5000, the hole injection layer may be dissolved when the hole transport layer and layers following the hole transport layer are formed. Further, when the Mw exceeds 300000, the material may be gelated, thereby causing difficulty in film formation.

Examples of a typical conductive polymer used as the material of the hole injection layer 12B may include polydioxythiophene such as polyaniline, oligoaniline, and poly (3,4-ethylenedioxythiophene) (PEDOT). In addition, a polymer commercially available under Nafion (trademark) from H.C. Starck GmbH and a polymer commercially available in a dissolved state under the trade name of Liquion (trademark), ELsource (trademark) manufactured by Nissan Chemical Industries, Ltd., a conductive polymer called Verazol (trademark) manufactured by Soken Chemical & Engineering Co., Ltd. or the like may be used. A thickness of the hole injection layer 12B depends on an entire device configuration, but may be within a range of 5 nm to 100 nm both inclusive.

The hole transport layer 12A is configured to enhance hole transport efficiency to each of the light-emitting layers (the red light-emitting layer 13R, the green light-emitting layer 13G, and the blue light-emitting layer 14B). As a polymer material forming the hole transport layer 12A, a light-emitting material soluble in an organic solvent, for example, polyvinylcarbazole, polyfluorene, polyaniline, polysilane, or a derivative thereof, a polysiloxane derivative having an aromatic amine in a side chain or a main chain, or polythiophene or a derivative thereof, polypyrrole, or the like may be used. More specifically, poly[(9,9-dioctylfluorenyl-2,7-diyl)-co-4,4'-(N-(4-sec-butylphenyl))diphenylamine)] (TFB, Expression (1-1)), poly[(9,9-dioctylfluorenyl-2,7-diyl)-alt-co-(N,N'-bis{4-butylphenyl}-benzidine N,N'-{1,4-diphenylene})] (Expression (1-2)), or poly[(9,9-dioctylfluorenyl-2,7-diyl)] (PFO, Expression (1-3)) may be preferable, but the polymer material is not limited thereto.

A weight-average molecular weight (Mw) of the polymer material as the material used for the hole transport layer 12A may be preferably within a range of 50000 to 300000 both inclusive, and may be specifically preferably within a range of 100000 to 200000 both inclusive. In a case where the Mw is less than 50000, when the light-emitting layer is formed, a low-molecular-weight component in the polymer material is lost to cause a dot in the hole injection layer 12B and the hole transport layer 12A; therefore, initial performance of the organic EL device may be degraded, or deterioration in the device may be caused. On the other hand, in a case where the Mw exceeds 300000, the material is gelated; therefore, film formation may be difficult. It is to be noted that the weight-average molecular weight (Mw) is a value determined by gel permeation chromatography (GPC) using polystyrene standards with use of tetrahydrofuran as a solvent. A thickness of the hole transport layer 12A depends on the entire device configuration, but may be within a range of 10 nm to 200 nm both inclusive.

(Red Light-Emitting Layer 13R)

The red light-emitting layer 13R is configured to generate light by the recombination of electrons and holes in response to the application of an electric field. A thickness of the red light-emitting layer 13R depends on the entire device configuration, but may be within a range of 10 nm to 200 nm both inclusive. This red light-emitting layer 13R includes, as a host material (a base material), a polymer material that does not emit (or does not mainly emit, the same applies hereinafter) red light (first color light), and includes, as a dopant, a low-molecular-weight material that emits red light. In this case, the low-molecular-weight material may be preferably a monomer or an oligomer, in which two to ten monomers are bonded to one another, with a weight-average molecular weight of 50000 or less. However, a low-molecular-weight material with a weight-average molecular weight exceeding the above-described range is not necessarily excluded.

The polymer material included as the host material in the red light-emitting layer 13R may be, for example, a polymer material that emits color light of a shorter wavelength (higher energy) than red light (for example, a wavelength of 620 to 750 nm both inclusive). In this embodiment, as such a polymer material, for example, a polymer material (a polymer light-emitting material G1) that emits color light (green light) having a spectral peak in a wavelength range of 500 to 550 nm both inclusive may be used. By such a configuration, red light with low energy is allowed to be emitted by so-called down-conversion (red light having lower energy than green light is emitted with use of green light as excitation light).

Examples of the polymer light-emitting material G1 may include a polyfluorene-based polymer derivative, a (poly) paraphenylene vinylene derivative, a polyphenylene derivative, a polyvinylcarbazole derivative, a polythiophene derivative, and a ci-dibenzofuran derivative. For example, this polymer light-emitting material G1 may be desirably a dendrimer including tris(2-phenylpyridine)iridium (III) in a core thereof or a polymer material with such a dendritic structure. For example, a phenyl carbazole group, a phenylene group, an ethylene group, or a fluorene group may be included in a dendron or a terminal group of the dendrimer. A light emission wavelength of the polymer light-emitting material G1 may be changed by changing a ligand of an iridium (Ir) complex in a side chain.

As an example of such a polymer light-emitting material G1, for example, GPP represented by the following general expression (1-1) or PNDOF represented by the following general expression (1-2) may be adopted. GPP is a green phosphorescent light-emitting material, but GPP may include, in addition to a phosphorescent light-emitting group, a hole transport group (for example, HMTPD) or an electron transport group (for example, TBPhB) in a side chain of a polyvinyl main chain skeleton.

[Chem. 1]

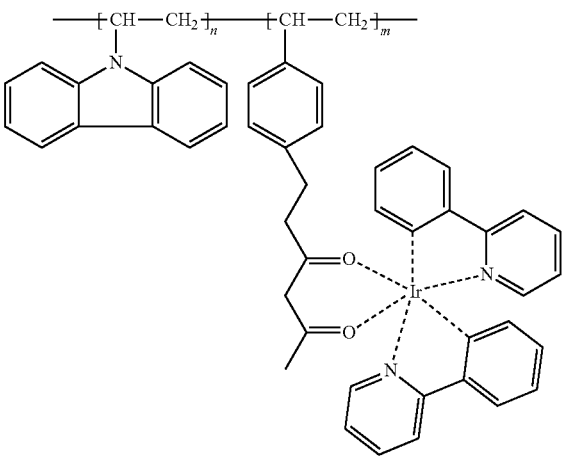

(1-1)

-continued

[Chem. 2]

(1-2)

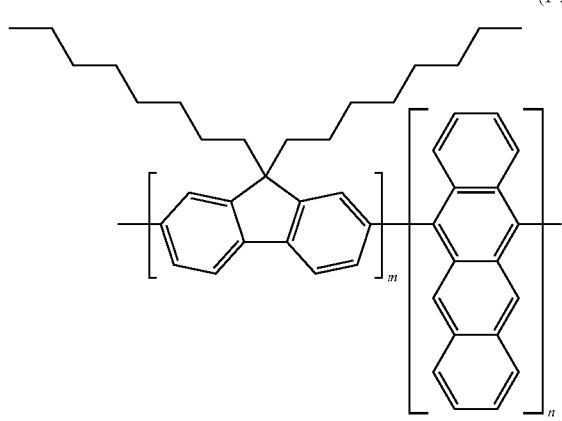

An example of a low-molecular-weight material (a low-molecular-weight light-emitting material r1) included as a dopant in the red light-emitting layer 13R may be a low-molecular-weight material having a red phosphorescent light-emitting property. More specifically, for example, bis (2-(2'-benzo[4,5-a]thienyl)pyridinato-N,C3')iridium acetylacetate (BtpIr) represented by the following general expression (2-1) may be adopted.

[Chem. 3]

(2-1)

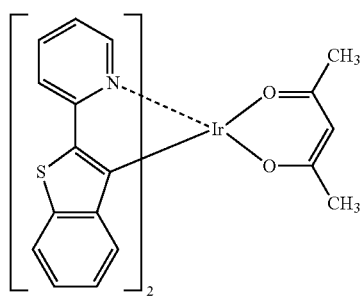

It is to be noted that, in addition, the low-molecular-weight light-emitting material r1 may be, for example, Nile red, DCM, or DJCT. However, to obtain red fluorescence with high efficiency, the low-molecular-weight light-emitting material r1 may be desirably the above-described Ir complex. Moreover, as long as the low-molecular-weight light-emitting material r1 has the red phosphorescent property, the low-molecular-weight light-emitting material r1 is not necessarily limited to the low-molecular-weight material, and polymer materials such as RPP represented by the following general expression (2-2) and PPDOF represented by the following general expression (2-3) may be adopted.

[Chem. 4]

(2-2)

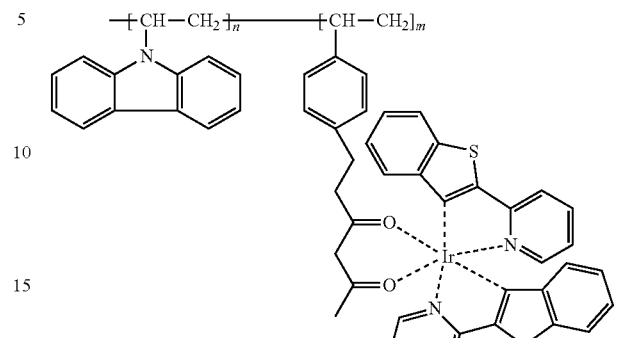

[Chem. 5]

(2-3)

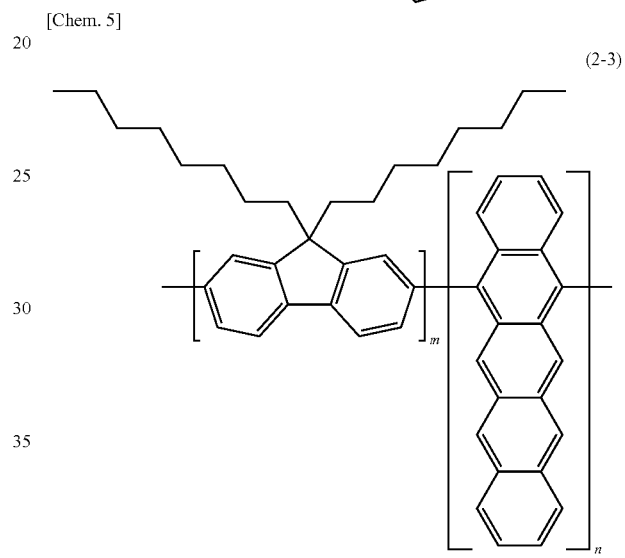

As will be described in detail later, the above-described red light-emitting layer 13R (and the green light-emitting layer 13G) may be formed by, for example, reverse offset printing. In the printing, the above-described polymer light-emitting material G1 and the low-molecular-weight light-emitting material r1 may be dissolved with use of, for example, one or more kinds of organic solvents such as toluene, xylene, anisol, cyclohexanone, mesitylene (1,3,5-trimethylbenzene), pseudocumene (1,2,4-trimethylbenzene), dihydrobenzofuran, 1,2,3,4-tetramethylbenzene, tetralin, cyclohexylbenzene, 1-methylnaphthalene, p-anisylalcohol, dimethylnaphthalene, 3-methylbiphenyl, 4-methylbiphenyl, 3-isopropylbiphenyl, and mono-isopropyl naphthalene. In the reverse offset printing of the red light-emitting layer 13R, a mixed solution of them, i.e., an ink (hereinafter referred to as "R ink") including the polymer light-emitting material G1, the low-molecular-weight light-emitting material r1, and the organic solvent may be used to be applied to a blanket by, for example, spin coating or the like.

In this case, a doping concentration of a dopant material in the host material (hereinafter simply referred to as "doping concentration") may be desirably 10 wt % or less in terms of efficiency. When the doping concentration is larger than 10 wt %, adjacent triplet excitons become inactive by interaction; therefore, it is difficult to obtain sufficient efficiency.

However, in the R ink of this embodiment, the host material is the polymer light-emitting material G1; therefore, when the doping concentration of the low-molecular-weight light-emitting material r1 is too low, G light emission is stronger than R light emission, and the color of light may become, for example, an orange color at color coordinates of (0.47, 0.50) in the CIE-xy chromaticity diagram. In this case, in G spectral intensity actually measured, the concentration of the low-molecular-weight light-emitting material r1 in the red light-emitting layer 13R is reduced to about ⅕ of that in the R ink. Moreover, it is found that the concentration of the low-molecular-weight light-emitting material r1 in the red light-emitting layer 13R is 4 wt % or more, G light emission is allowed to be suppressed. Therefore, the concentration of the low-molecular light-emitting material r1 in the R ink may be desirably 20 wt % or more. As will be described later, in a case where the concentration of the low-molecular-weight light-emitting material r1 is 30 wt % or more, for example, red at color coordinates of (0.60, 0.39) and 14.2 cd/A is allowed to be obtained.

It is to be noted that the low-molecular-weight material (a monomer or a oligomer) refers to a material having substantially a single molecular weight other than a compound configured of molecules of a polymer or a condensate with a high molecular weight generated by chain-like repetition of same or similar reaction of the low-molecular-weight compound. Moreover, in the low-molecular-weight material, a new chemical bond between molecules by heating does not occur, and the low-molecular-weight material exists as a single molecule. The weight-average molecular weight (Mw) of such a low-molecular material may be preferably 50000 or less.

Moreover, in a case where the above-described R polymer light-emitting material is used instead of the low-molecular-weight light-emitting material r1, the number of R phosphorescent groups with respect to weight is small; therefore, the concentration of the R polymer light-emitting material in the R ink may be desirably higher than that in a case where the low-molecular-weight material is used, and may be desirably, for example, 30 wt % or more.

Further, the red light-emitting layer 13R may include the following low-molecular-weight material as a low-molecular-weight hole transport material, a low-molecular-weight host material, or a spiro-based material. For example, benzene, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, or a derivative thereof, or a heterocyclic conjugated monomer or oligomer such as a polysilane-based compound, a vinylcarbazole-based compound, a thiophene-based compound, or an aniline-based compound may be adopted.

As a specific material, α-naphthyl phenyl phenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano4,4,4-tris (3-methylphenylphenylamino)triphenylamine, N,N,N',N'-tetrakis(p-tolyl)p-phenylenediamine, N,N,N',N'-tetraphenyl-4,4'-diaminobiphenyl, N-phenyl carbazole, 4-di-p-tolylaminostilbene, poly(paraphenylene vinylene), poly(thiophenevinylene), poly(2,2'-thienylpyrrole), or the like may be adopted; however, the specific material is not limited thereto.

Preferably, low-molecular-weight materials represented by the following expressions (3-1) to (3-3) may be used.

[Chem. 6]

(3-1)

(Each of A1 to A3 is an aromatic hydrocarbon group, a heterocyclic group, or a derivative thereof.)

[Chem. 7]

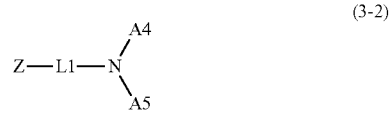

(3-2)

(Z is a nitrogen-containing hydrocarbon group or a derivative thereof. L1 is a group formed by bonding one to four divalent aromatic ring groups, more specifically, a divalent group in which one to four aromatic rings are connected to one another, or a derivative thereof. Each of A4 and A5 is an aromatic hydrocarbon group or an aromatic heterocyclic group, or a derivative thereof. However, A4 and A5 may be bonded to each other to form a cyclic structure.)

[Chem. 8]

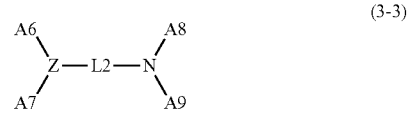

(3-3)

(L2 is a group formed by bonding two to six divalent aromatic ring groups. More specifically, L2 is a divalent group formed by connecting two to six aromatic rings to one another, or a derivative thereof. Each of A6 to A9 is a group formed by bonding one to ten aromatic hydrocarbon groups, one to ten heterocyclic groups, or one to ten derivatives thereof.)

Moreover, in the red light-emitting layer 13R, as a G quencher, a hole transport low-molecular-weight material having a T2 level between a T2 level of a green light-emitting polymer and a T1 level of a red light-emitting polymer may be added. Examples of such a low-molecular-weight material may include amine-based low-molecular-weight materials as represented by the following general expressions (4-1) to (4-16).

[Chem. 9]

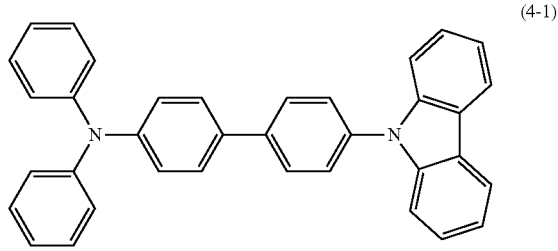

(4-1)

(4-2)
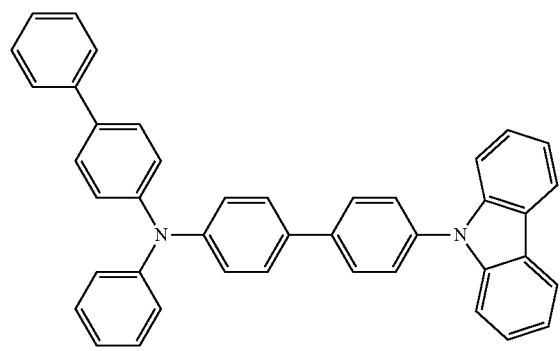
(4-3)
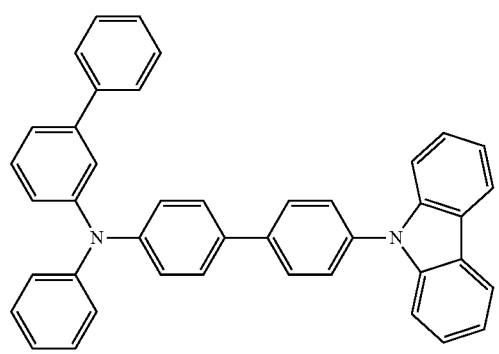
(4-4)
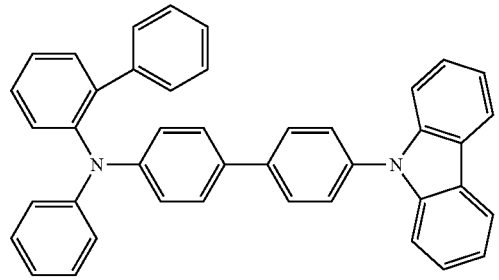
(4-5)
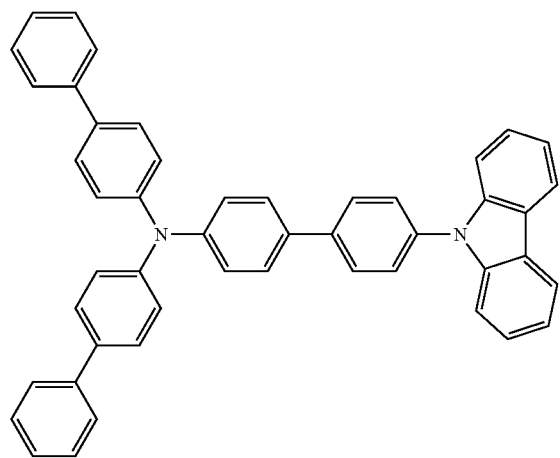
(4-6)
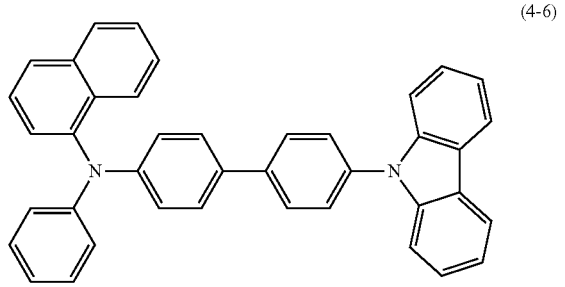
(4-7)
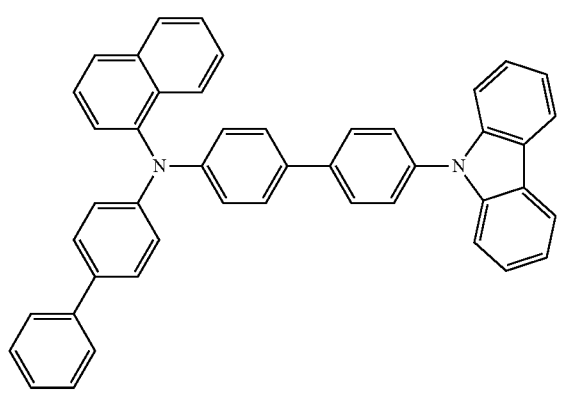
(4-8)
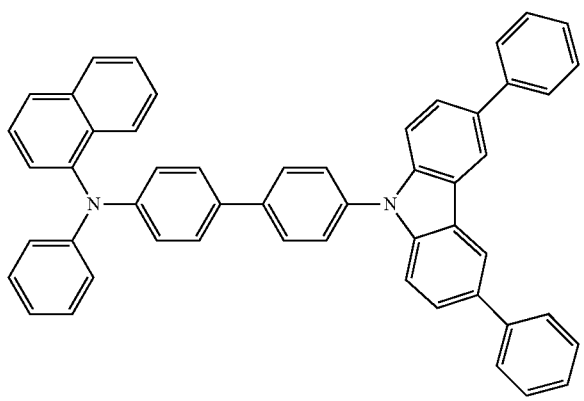
(4-9)
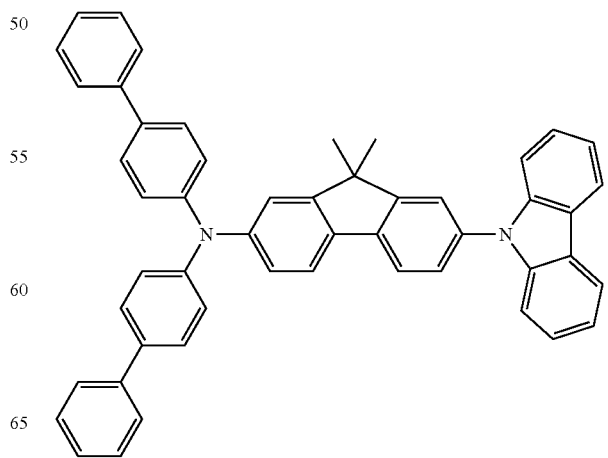

(4-10)
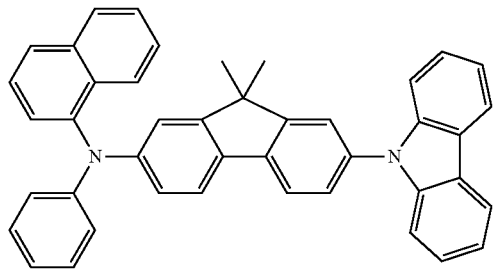

(4-11)
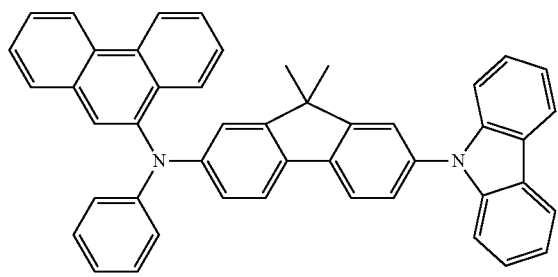

(4-12)
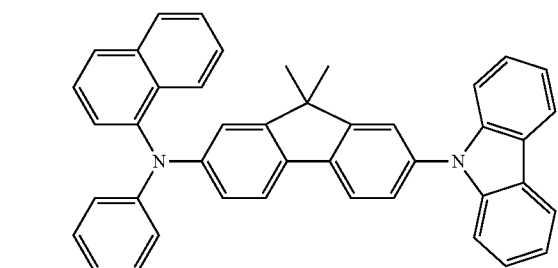

(4-13)
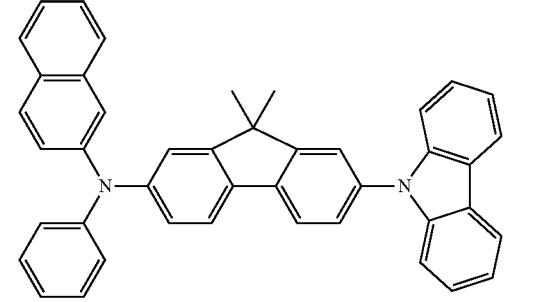

(4-14)
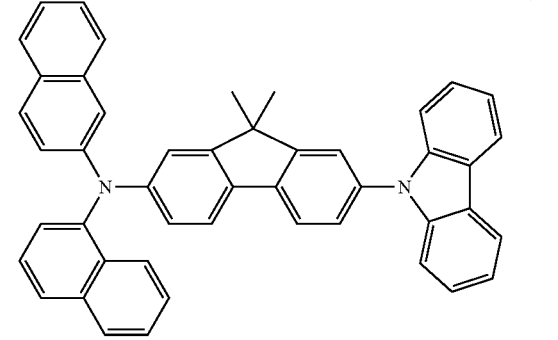

(4-15)
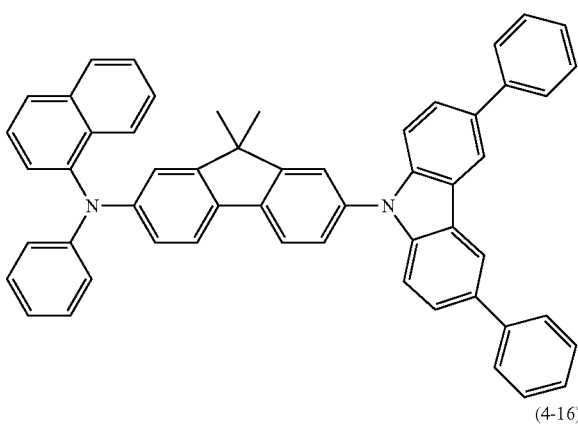

(4-16)
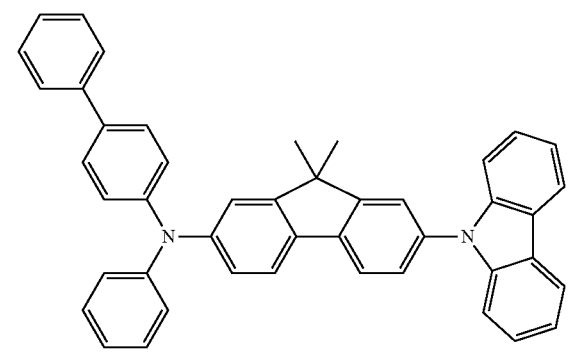

(Green Light-Emitting Layer 13G)

The green light-emitting layer 13G is configured to generate green light by the recombination of electrons and holes in response to the application of an electric field. A thickness of the green light-emitting layer 13G depends on the entire device configuration, but may be within a range of 10 nm to 200 nm both inclusive. The green light-emitting layer 13R includes a polymer light-emitting material or a low-molecular-weight light-emitting material that emits green light, or both. As the polymer light-emitting material used in the green light-emitting layer 13G, similar materials listed as the above-described polymer light-emitting material G1 may be adopted. For example, a polyfluorene-based polymer derivative, a (poly)paraphenylene vinylene derivative, a polyphenylene derivative, a polyvinylcarbazole derivative, a polythiophene derivative, or a ci-dibenzofuran derivative may be adopted. The polymer light-emitting material may be desirably cross-linked as a polymer, but may be a dendrimer with a molecular weight of 5000 or more or a polymer material having such a dendritic structure. Moreover, a light emission wavelength of the polymer light-emitting material in the green light-emitting layer 13G may be changed by changing a ligand of an iridium (Ir) complex in a side chain.

As with the above-described red light-emitting layer 13R, the green light-emitting layer 13G may also include the low-molecular-weight material as represented by the above-described expressions (3-1) to (3-3); however, an amine-based low-molecular-weight material as the G quencher may not be desirably included.

Near an interface with another layer above or below the green light-emitting layer 13G (in this case, near an interface with the hole transport layer 12A), a thin film layer 13a including siloxane or the like is formed, and the lowmolecular-weight light-emitting material r1 included in the red light-emitting layer 13R is adhered. The thin film layer 13a and the low-molecular-weight light-emitting material r1 are formed in the device region of the organic EL device 10G in reverse offset printing that will be described later (as imprints of the reverse offset printing).

(Connection Layer 14)

Since the connection layer 14 may be formed by, for example, a vacuum evaporation method, the connection layer 14 may be preferably made of a low-molecular-weight material (in particular, a monomer). This is because polymerized molecules such as an oligomer or a polymer material may be decomposed during evaporation. It is to be noted that, in the connection layer 14, a mixture of two or more kinds of low-molecular-weight materials with different molecular weights may be used, or the two or more kinds of the low-molecular-weight materials may be laminated. It is to be noted that a thickness of this connection layer 14 may be desirably 1 nm or more, and characteristics of the blue light-emitting layer 14B are allowed to be improved accordingly.

(Blue Light-Emitting Layer 14B)

The blue light-emitting layer 14B is configured to generate blue light by the recombination of electrons and holes in response to the application of an electric field. In this embodiment, in the blue light-emitting layer 14B, an anthracene compound as a host material is doped with a blue or green fluorescent dye as a guest material, and the blue light-emitting layer 14B generates blue or green emission light. As the host material, an anthracene derivative represented by the following general expression (5) may be preferably used as the host material.

[Chem. 10]

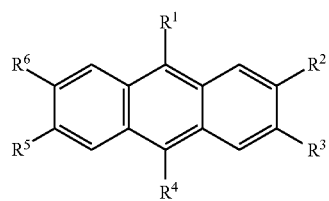

(5)

However, in the above-described general expression (5), R1 to R6 are independently hydrogen, a halogen, a hydroxyl group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a cyano group, a nitro group, a substituted or unsubstituted silyl group with 30 or less carbon atoms, a substituted or unsubstituted aryl group with 30 or less carbon atoms, a substituted or unsubstituted heterocyclic group with 30 or less carbon atoms, or a substituted or unsubstituted amino group with 30 or less carbon atoms.

Examples of the aryl group may include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, a m-tolyl group, a p-tolyl group, and a p-t-butylphenyl group.

Examples of the heterocyclic group may include a five- or six-membered ring aromatic heterocyclic group containing O, N, and S as hetero atoms, or a condensed polycyclic aromatic heterocyclic group with 2 to 20 carbon atoms. Moreover, examples of the aromatic heterocyclic group and the condensed polycyclic aromatic heterocyclic group may include a thienyl group, a furyl group, a pyrrolyl group, a pyridyl group, a quinolyl group, a quinoxalyl group, an imidazopyridyl group, and a benzothiazole group. Representative examples may include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, and a 9-acridinyl group.

The amino group may be any of an alkylamino group, an arylamino group, an aralkylamino group, and the like. They may preferably include an aliphatic group with 1 to 6 carbon atoms in total and/or one to four aromatic carbon rings. Such groups may include a dimethylamino group, a diethylamino group, a dibutylamino group, a diphenylamino group, a ditolylamino group, a bisbiphenylylamino group, and a dinaphthylamino group.

It is to be noted that two or more kinds of the above-described substituted groups may form a condensed ring or may further include a substituted group.

As a light-emitting guest material included in the blue light-emitting layer 14B, a material with high light emission efficiency, for example, a low-molecular-weight fluorescent or phosphorescent dye may be used, and an organic light-emitting material such as a metal complex may be further used. As used herein, the blue light-emitting guest material refers to a compound having a peak in a light emission wavelength range of about 400 nm to about 490 nm both inclusive. As such a compound, organic materials such as a naphthalene derivative, an anthracene derivative, a naphthacene derivative, a styrylamine derivative, and a bis(azinyl)methene boron complex are used. In particular, the blue light-emitting guest material may be preferably selected from an aminonaphthalene derivative, an aminoanthracene derivative, an aminochrysene derivative, an aminopyrene derivative, a styrylamine derivative, and a bis(azinyl) methene boron complex. More specifically, for example, a material mixed with 2.5 wt % of 4,4'-bis[2-{4-(N,N-diphenylamino)phenyl}vinyl]biphenyl (DPAVBi) may be adopted.

The electron transport layer 15A is configured to enhance electron transport efficiency to the red light-emitting layer 13R, the green light-emitting layer 13G, and the blue light-emitting layer 14B, and is provided as a common layer on an entire surface of the blue light-emitting layer 14B. Examples of a material of the electron transport layer 15A may include quinoline, perylene, phenanthroline, bisstyryl, pyrazine, triazole, oxazole, fullerene, oxadiazole, fluorenone, and a derivative thereof, and a metal complex. More specifically, tris(8-hydroxyquinoline)aluminum (Alq3 for short), anthracene, naphthalene, phenanthrene, pyrene, anthracene, perylene, butadiene, coumarin, C60, acridine, stilbene, 1,10-phenanthroline, or a derivative thereof, or a metal complex may be adopted.

The electron injection layer 15B is configured to enhance electron injection efficiency, and is provided as a common layer on an entire surface of the electron transport layer 15A. As a material of the electron injection layer 15B, for example, lithium oxide ($Li_2O$) as an oxide of lithium (Li), cesium carbonate ($Cs_2CO_3$) as a complex oxide of cesium (Cs), and a mixture of the oxide and the complex oxide may be used. Moreover, the electron injection layer 15B is not limited to such materials, and, for example, an alkali earth metal such as calcium (Ca) and barium (Ba), lithium, an alkali metal such as cesium, a metal with a small work function such as indium (In) and magnesium (Mg), and oxides, complex oxides, fluorides, and the like of these metals may be used in a simple substance form or as a mixture or an alloy of these metals, these oxides, these complex oxides, and these fluorides to enhance stability.

The upper electrode 16 may have, for example, a thickness of 2 nm to 15 nm both inclusive, and may be configured of a metal conductive film. More specifically, an alloy of Al, Mg, Ca, or Na may be adopted. In particular, an alloy of magnesium and silver (a Mg—Ag alloy) may be preferable, because the alloy has both conductivity and small absorption in a thin film. The ratio between magnesium and silver in the Mg—Ag alloy is not specifically limited; however, the ratio may be desirably within a range of Mg:Ag=20:1 to 1:1 in a film thickness ratio. Moreover, a material of the upper electrode 16 may be an alloy of Al and Li (an Al—Li alloy).

Further, the upper electrode 16 may be configured of a mixture layer including an organic light-emitting material such as an aluminum quinoline complex, a styrylamine derivative, or a phthalocyanine derivative. In this case, the upper electrode 16 may separately include a layer with light transparency such as MgAg as a third layer. It is to be noted that the upper electrode 16 is used as a common electrode for the organic EL devices 10R, 10G, and 10B.

It is to be noted that a protective layer (not illustrated) formed on the upper electrode 16 may have, for example, a thickness of 2 to 3 μm both inclusive, and may be made of one of an insulating material or a conductive material. As the insulating material, an inorganic amorphous insulating material, for example, amorphous silicon (α-Si), amorphous silicon carbide (α-SiC), amorphous silicon nitride (α-$Si_{1-x}N_x$), amorphous carbon (α-C), or the like may be preferable. Such an inorganic amorphous insulating material does not form grains; therefore, the inorganic amorphous insulating material has low water permeability, and forms a favorable protective film. Moreover, the sealing substrate is made of a material, such as glass, transparent to light generated by the organic EL devices 10R, 10G, and 10B, and, for example, a color filter and a light-shielding film (both not illustrated) may be provided to the sealing substrate. Thus, contrast is allowed to be improved by extracting color light generated by each of the organic EL devices 10R, 10G, and 10B and absorbing reflected light or the like of external light.

For example, this organic EL display unit may be manufactured as follows.

FIGS. 4 to 5B illustrate a method of manufacturing the above-described organic EL display unit in process order. First, although not illustrated, the pixel drive circuit 140 including the driving transistor Tr1 is formed on the substrate 110 made of the above-described material, and a planarization insulating film (not illustrated) made of, for example, a photosensitive resin is provided. After that, the lower electrodes 11 for respective device regions 10r1, 10g1, and 10b1 of the organic EL devices 10R, 10G, and 10B are formed. Next, oxygen plasma treatment is performed on a surface where the lower electrodes 11 are formed of the substrate 110 to remove contaminants such as an organic substance adhered to the surface, thereby improving wettability.

Next, as illustrated in FIG. 4, the lower electrodes 11 are coated with the hole injection layer 12B (for example, ELsource or ND1501 manufactured by Nissan Chemical Industries. Ltd.) by, for example, spin coating, and the hole injection layer 12B is heated for 1 hour at a temperature of 220° C. in air with use of a hot plate to be thermally cured. Next, the hole transport layer 12A (TFB) is applied by, for example, spin coating, and is heated for 1 hour at a temperature of 180° C. in nitrogen with use of a hot plate to be thermally cured.

Next, the red light-emitting layer 13R and the green light-emitting layer 13G are pattern-formed on the hole transport layer 12A by reverse offset printing. The formation order of the red light-emitting layer 13R and the green light-emitting layer 13G is not specifically limited; however, in this embodiment, a case where the red light-emitting layer 13R is formed as a first color, and the green light-emitting layer 13G is formed as a second color is adopted as an example.

First, as illustrated in FIG. 5A, the red light-emitting layer 13R (the polymer light-emitting material G1 and the low-molecular-weight light-emitting material r1) is formed in the device region 10r1 on the hole transport layer 12A by reverse offset printing. FIGS. 6A to 8C schematically illustrate a specific procedure of the reverse offset printing.

More specifically, a blanket 60 made of silicon (for example, Fujikura Rubber Ltd. (STD700)) is prepared, and a surface of the blanket 60 is swollen. An entire surface on the blanket 60 is coated with, for example, a solution including a hole transport material such as siloxane by, for example, a spin coating method. Accordingly, a surface layer of the blanket 60 is turned to a swollen state, and the surface of the blanket 60 is allowed to be maintained at moderate humidity, and favorable film formation is possible in the following transfer process accordingly. Next, as illustrated in FIG. 6A, the above-described R ink (an ink prepared, for example, by adding 30 wt % of the low-molecular-weight light-emitting material r1 (BtpIr) to the polymer light-emitting material G1 and dissolving the resultant in xylene) is dropped on the entire surface of the blanket 60. After that (for example, after 1 minute), as illustrated in FIG. 6B, for example, the blanket 60 is rotated at, for example, 3000 rpm²/sec to perform spin coating.

Next, a printing pattern layer (a printing pattern layer 13r1) of the red light-emitting layer 13R is formed on the blanket 60. More specifically, first, as illustrated in FIG. 7A, an intaglio plate 61 having a depressed portion corresponding to the device region 10r1 and a layer of an ink D1r of the blanket 60 are arranged to face each other, and as illustrated in FIG. 7B, the intaglio plate 61 is pressed against the layer of the ink D1r on the blanket 60, and is pressurized by a roller or the like. After that, as illustrated in FIG. 7C, an unnecessary portion (D1r') of the layer of the ink D1r is transferred to a protruded portion of the intaglio plate 61 by peeling the blanket 60 from the intanglio plate 61 to be removed (taken off) from the blanket 60. Accordingly, the printing pattern 13r1 corresponding to the device region 10r1 of the red light-emitting layer 13R is formed on the blanket 60. It is to be noted that a linear pattern is illustrated in the diagram; however, as long as the pattern is consistent with a TFT pixel arrangement, the shape of the pattern is not limited to the linear pattern.

Next, the printing pattern layer 13r1 of the red light-emitting layer 13R on the blanket 60 is transferred to the substrate 110 side. More specifically, first, as illustrated in FIG. 8A, the substrate 110 on which the hole injection layer 12B and the hole transport layer 12A have been already formed and the blanket 60 are arranged to face each other. At this time, more specifically, as illustrated in a right diagram in the FIG. 8A, a residual portion Xr that has not been taken off by the intaglio plate 61 is formed in a region other than the printing pattern layer 13r1 on the surface of the blanket 60 before transfer. This residual portion Xr may include, for example, the hole transport material (such as siloxane) and the low-molecular-weight light-emitting material r1, and is transferred to other device regions (for example, the device region 10g1) by being transferred together with the printing pattern layer 13r1.

After that, the substrate 110 and the printing pattern layer 13r1 are aligned, and as illustrated in FIG. 8B, the printing pattern layer 13r1 of the blanket 60 is pressed against the substrate 110. Next, the red light-emitting layer 13R is pattern-formed on the substrate 110 by peeling the blanket 60 from the substrate 110 (FIG. 8C). Moreover, at this time, although not illustrated in FIG. 8C, the residual portion Xr formed on the blanket 60 is also transferred to the substrate 110 concurrently.

Next, as illustrated in FIG. 5B, as with the case of the above-described red light-emitting layer 13R, the green light-emitting layer 13G is formed in the device region 10g1 by reverse offset printing. It is to be noted that, as an ink used at this time, for example, an ink prepared by dissolving, in xylene, a dendrimer type polymer material including the above-described tris(2-phenylpyridine)iridium (III) in a core thereof may be used.

After that, for example, the substrate 110 on which the red light-emitting layer 13R and the green light-emitting layer 13G have been formed by transfer is heated for 30 minutes at 130° C. in an nitrogen atmosphere with use of a hot plate to be thermally cured.

Next, the connection layer 14, the blue light-emitting layer 14B, and the electron transport layer 15A that are made of the above-described materials or the like are formed on the red light-emitting layer 13R and the green light-emitting layer 13G by, for example, a vacuum evaporation method. As the blue light-emitting layer 14B, for example, ADN (9,10-di(2-naphthyl)anthracene) and a blue dopant at a weight ratio of 95:5 are co-evaporated. As the electron transport layer 15A, for example, a film of Alq3 (8-hydroxy-quinoline aluminum) may be formed with a thickness of 15 nm by a vacuum evaporation method. As the electron injection layer 15B, for example, a film of LiF may be formed with a thickness of 0.3 nm.

Next, the upper electrode 16 is formed on the electron injection layer 15B by, for example, a vacuum evaporation method or a sputtering method. As the upper electrode 16, for example, aluminum may be evaporated to 150 nm. After that, a protective film made of the above-described material is formed by, for example, an evaporation method or a CVD method, and then a sealing substrate provided with the color filter and the like is bonded onto the protective layer with an adhesive layer in between. Thus, the organic EL display unit illustrated in FIG. 3 is allowed to be formed.

In the organic EL display unit of this embodiment, the red light-emitting layer 13R includes, as a host material, the polymer material (the polymer light-emitting material G1) that does not emit red light, and includes, as a dopant, the low-molecular-weight material (the low-molecular-weight light-emitting material r1) that emits red light. Therefore, in the organic EL device 10R, red light emission is obtained by so-called down-conversion.

On the other hand, in a case where such a red light-emitting layer 13R is formed by, for example, reverse offset printing, color mixture into other pixels due to a residue on the blanket is an issue. However, in this embodiment, in the ink D1r used to form the red light-emitting layer 13R, the concentration of the polymer light-emitting material G1 that emits green light is higher than that of the low-molecular-weight material r1 that emits red light. Therefore, in the organic EL device 10G, even in a case where the above-described dye residue (the residual portion Xr) is transferred, compared to a case where an ink made of a red light-emitting polymer material is used, an amount of an adhered red dye is reduced to reduce an influence of red light. Moreover, the polymer light-emitting material G1 is allowed to be used as the host material with use of down-conversion, and while viscosity necessary for reverse offset printing is maintained in the ink D1r, an influence of the ink D1r on the green light-emitting layer 13G is allowed to be suppressed.

Therefore, in this embodiment, even in a case where the red light-emitting layer 13R is formed by reverse offset printing, mixture of red into the green light-emitting layer 13G is suppressed. Accordingly, in the organic EL display unit, when a plurality of light-emitting layers emitting color light of different wavelengths are pattern-formed, color mixture is allowed to be suppressed, thereby improving display quality.

Example 1

Now, as Example 1, the above-described organic EL devices 10R and 10G were formed, and when xy chromaticity and light emission intensity of the organic EL device 10G were measured, mixture of red light into the green light-emitting layer 13G was not observed, and xy chromaticity coordinates of (0.31, 0.64) and efficiency of 30 cd/A were allowed to be obtained. Moreover, as illustrated in FIG. 9, spectral intensity at a wavelength of 600 nm was 0.015, and a sub-peak was not observed in a spectrum. Further, in the red light-emitting layer 13R, red at (0.60, 0.39) and 14 cd/A was allowed to be obtained. It is to be noted that, as the ink used to form the red light-emitting layer 13R, an ink prepared by adding the low-molecular-weight light-emitting material r1 (BtpIr) at a concentration of 30 wt % in the polymer light-emitting material G1 to the dendrimer type polymer material including tris(2-phenylpyridine)iridium (III) in a core thereof and dissolving a resultant in xylene was used. Moreover, as an ink used to form the green light-emitting layer 13G, an ink prepared by dissolving a dendrimer type polymer material including tris(2-phenylpyridine)iridium (III) in a core thereof in xylene was used.

Comparative Example

As a comparative example of the above-described Example 1, when reverse offset printing was performed with use of, as an R ink, an ink prepared by dissolving a polymer light-emitting material (RPP) in xylene, mixture of red into the green light-emitting layer was observed, and xy chromaticity coordinates of (0.33, 0.62) and efficiency of 29 cd/A were obtained. Moreover, as illustrated in FIG. 9, spectral intensity at a wavelength of 600 nm was 0.02, and a sub-peak was observed. Further, in the red light-emitting layer, (0.62, 0.34) and 15 cd/A were obtained.

Example 2

Moreover, xy chromaticity and light emission intensity of the organic EL device 10G were measured in a manner similar to the above-described Example 1, except that an ink prepared by adding 20 wt % of a red polymer phosphorescent dopant (RPP) to the polymer light-emitting material G1 similar to that in the above-described Example 1 and dissolving a resultant in xylene was used as the R ink. As a result, mixture of red light into the green light-emitting layer 13G was not observed, and xy chromaticity coordinates of (0.31, 0.64) and efficiency of 30 cd/A were allowed to be obtained. Moreover, as illustrated in FIG. 10, spectral intensity at a wavelength of 600 nm was 0.015, and a sub-peak was hardly observed in a spectrum. Further, in the red light-emitting layer 13R, red at (0.60, 0.39) and 13 cd/A was allowed to be obtained. It is to be noted that, in FIG. 10, results of Example 1 and the comparative example are also illustrated. Moreover, it was found that, in the above-described Example 1 using an R low-molecular-weight dopant, compared to Example 2 using an R polymer dopant, spectral intensity around a wavelength of 600 nm was decreased. This is because a recombination ratio with respect to red light is allowed to be reduced when the R low-molecular-weight material exists near an interface with the hole transport layer 12A, compared to a case where a bipolar-type R polymer material such as RPP exists near the interface. Therefore, in Example 1, mixture of red light is allowed to be suppressed more than in Example 2.

Example 3

Moreover, xy chromaticity and light emission intensity of the organic EL device 10G were measured in a manner similar to the above-described Example 1, except that an ink prepared by adding 27 wt % of a red low-molecular-weight phosphorescent dopant (BtpIr) and a compound represented by the above-described general expression (4-2) to the polymer light-emitting material G1 similar to that in the above-described Example 1 and dissolving a resultant in xylene was used as the R ink. As a result, mixture of red light into the green light-emitting layer 13G was not observed, and xy chromaticity coordinates of (0.31, 0.64) and efficiency of 30 cd/A were allowed to be obtained. Moreover, spectral intensity at a wavelength of 600 nm was 0.015, and a sub-peak was not observed in a spectrum. Further, in the red light-emitting layer 13R, red at (0.61, 0.37) and 14 cd/A was allowed to be obtained.

Example 4

On the other hand, a suitable R dopant concentration (a mixture ratio of the low-molecular-weight light-emitting material r1 in the polymer light-emitting material G1) in the R ink including the polymer light-emitting material G1 and the low-molecular-weight light-emitting material r1 is different depending on intended use. For example, a suitable range of the R dopant concentration is different between a case where a film is formed by a spin coating method and a case where a film is formed by reverse offset printing as with this embodiment. Now, as Example 4-1, an R ink for spin coating (R ink $I_1$ for the sake of convenience) was adjusted, and peak intensity of G light in a red light-emitting layer formed with use of this R ink $I_1$ was measured. At that time, the R dopant concentration of the R ink $I_1$ was changed to 1%, 2%, and 10%. Moreover, as Example 4-2, an R ink for reverse offset printing (R ink $I_2$ for the sake of convenience) was adjusted, and peak intensity of G light in a red light-emitting layer formed with use of this R ink $I_2$ was measured. At that time, the R dopant concentration of the R ink $I_2$ was changed to 10%, 27%, and 30%. Some of these results are illustrated in FIG. 11. It is to be noted that a ratio noted in brackets indicates a volume ratio (G1:r1) between the polymer light-emitting material G1 (a polymer material similar to that in Example 1) and the low-molecular-weight light-emitting material r1 (BtpIr) in each of the R inks $I_1$ and $I_2$. As a result, first, in Example 4-1 using the R ink $I_1$ for spin coating, when the R dopant concentration was 1%, the peak intensity was 0.06, and when the R dopant concentration was 2%, the peak intensity was 0.03. It was found from these results that, when the R dopant concentration was about 3% or more, G light emission was allowed to be reduced to nearly 0 (zero). Actually, it was confirmed that, when the R dopant concentration was 10%, the peak intensity was 0. On the other hand, in Example 4-2 using the R ink $I_2$ for reverse offset printing, even though the R dopant concentration was 10%, the peak intensity was about 0.03; therefore, to reduce an influence of G light emission, it may be desirable that the R dopant concentration be 20%, that is twice higher than 10%, or more. Actually, although not illustrated in FIG. 11, it was confirmed that, when the R dopant concentration was 27%, the peak intensity was about 0.01, and when the R dopant concentration was 30%, the peak intensity was 0. Accordingly, a suitable R dopant concentration in the R ink is different depending on a forming method, and the R dopant concentration in the R ink for reverse offset printing may be desirably higher than that in the R ink for spin coating. Moreover, in this embodiment, a case where each color light-emitting layer is formed mainly by reverse offset printing is exemplified; however, each color light-emitting layer is allowed to be formed by other methods, for example, a coating method such as a spin coating method by appropriately setting the R dopant concentration. In other words, the R ink ("ink" in the present disclosure) described in this embodiment is applicable to not only reverse offset printing but also other film formation methods.

It is to be noted that, in the above-described first embodiment, in the red light-emitting layer 13R, the polymer light-emitting material G1 that emits green light is the host material; however, as long as the host material causes down-conversion in combination, the host material is not limited thereto. For example, the red light-emitting layer 13R may include a blue light-emitting polymer material (PADOF) represented by the following general expression (6) as the host material instead of the polymer light-emitting material G1. Moreover, the green light-emitting layer 13G may include, as a host material, the blue light-emitting polymer material represented by the general expression (6) and may include, as a dopant, a green light-emitting low-molecular-weight material represented by the following general expression (7). Even in this case, mixture of green light into the blue light-emitting layer caused by adhesion of a green dye to the device region of the organic EL device 10B in a case where the green light-emitting layer 13G is formed by reverse offset printing is allowed to be suppressed. Moreover, a configuration provided with a yellow light-emitting layer instead of the red light-emitting layer 13R may be adopted. This yellow light-emitting layer may include, as a dopant, a yellow light-emitting low-molecular-weight material represented by the following general expression (8), i.e., bis(2-phenylbenzothiozolato-N,C2)Iridium (acetylacetonate) ($Bt_2Ir(acac)$), for example.

[Chem. 11]

(6)

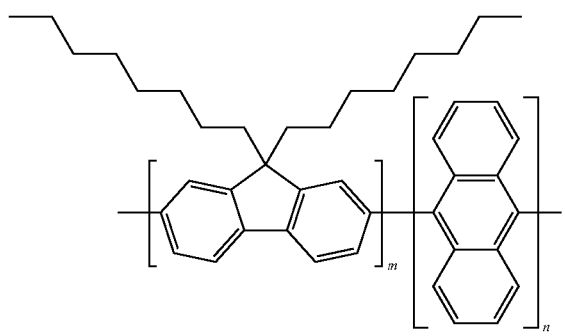

[Chem. 12]

(7)

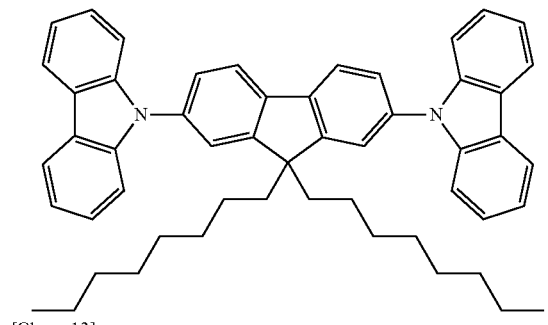

[Chem. 13]

(8)

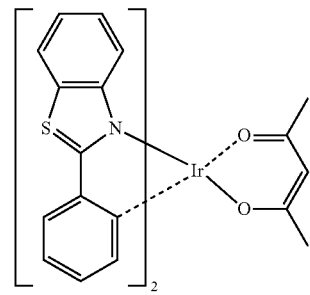

Second Embodiment

Like components are denoted by like numerals as of the above-described first embodiment and will not be further described. Although a configuration of an organic EL display unit according to a second embodiment of the present disclosure is not illustrated, as with the first embodiment, for example, a display region in which a plurality of organic EL devices 10R, 10G, and 10B are arranged in a matrix on the substrate 110 may be formed. A pixel drive circuit is provided in the display region. FIG. 12 illustrates a sectional configuration of the organic EL unit in the second embodiment. In the above-described first embodiment, in the red light-emitting layer 13R, as the polymer material that does not emit red light, the polymer light-emitting material G1 that emits green light is exemplified; however, the polymer material as the host material used for the red light-emitting layer 13R may be a so-called thickener. Examples of the thickener may include polymer materials represented by the following general expressions (9-1) to (9-3). Thus, the polymer material used for the red light-emitting layer 13R (or the green light-emitting layer 13G) may be a polymer material that does not have a phosphorescence property.

[Chem. 14]

(9-1)

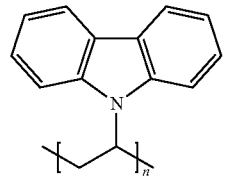

[Chem. 15]

(9-2)

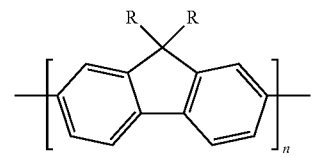

[Chem. 16]

(9-3)

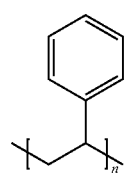

Application Examples

Application examples of the organic EL display units described in the above-described embodiments will be described below. The organic EL display units of the above-described embodiments are applicable to display units of electronic apparatuses in any fields that display, as an image or a picture, an image signal input from outside or an image signal produced inside, such as televisions, digital cameras, notebook personal computers, portable terminal devices such as cellular phones, and video cameras.

FIGS. 13A and 13B illustrate an appearance of a smartphone. This smartphone may include, for example, a display section 110 (an organic EL display unit), a non-display section (an enclosure) 120, and an operation section 130. The operation section 30 may be disposed on a front surface of the non-display section 120 as illustrated in FIG. 13A, or may be disposed on a top surface of the non-display section 120 as illustrated in FIG. 13B.

FIG. 14 illustrates an appearance configuration of a television. This television may include, for example, an image display screen section 200 (a display unit 1) including a front panel 210 and a filter glass 220.

FIGS. 15A and 15B illustrate appearance configurations viewed from a front side and a back side of a digital still camera, respectively. This digital still camera may include, for example, a light-emitting section 10 for a flash, a display section 320 (the organic EL display unit), a menu switch 330, and a shutter button 340.

FIG. 16 illustrates an appearance configuration of a notebook personal computer. This personal computer may include, for example, a main body 410, a keyboard 420 for operation of inputting characters and the like, and a display section 430 (the organic EL display unit) that displays an image.

FIG. 17 illustrates an appearance configuration of a video camera. This video camera may include, for example, a main body section 510, a lens 520 provided on a front side surface of the main body section 510 and for shooting an image of a subject, a shooting start and stop switch 530, and a display section 540 (the organic EL display unit).

FIGS. 18A and 18B illustrate an appearance configuration of a cellular phone. This cellular phone may have a configuration in which, for example, a top-side enclosure 610 and a bottom-side enclosure 620 are connected together through a connection section (hinge section) 630, and the cellular phone may include a display 640 (the display unit 1), a sub-display 650, a picture light 660, and a camera 670.

Although the present disclosure is described referring to the embodiments and the examples, the present disclosure is not limited thereto, and may be variously modified. For example, in the above-described embodiments and the like, as the ink of the present disclosure, the ink used for reverse offset printing is described as an example; however, the ink of the present disclosure is not limited thereto, and is applicable to other various methods (a coating method or a printing method) in which, to a pixel of a certain color (a G pixel in the above-described example), an ink of another color (the R ink in the above-described example) may be adhered. Likewise, in the organic EL display unit, the method of manufacturing the organic EL display unit, and the electronic apparatus of the present disclosure, the first light-emitting layer is not limited to a layer formed by reverse offset printing.

Moreover, the material and thickness of each layer, the method and conditions of forming each layer are not limited to those described in the above-described embodiments and the examples, and each layer may be made of any other material with any other thickness by any other method under any other conditions.

Further, in the above-described embodiments, a case of an active matrix display unit is described: however, the present disclosure is applicable to a passive matrix display unit. Furthermore, the configuration of a pixel drive circuit for active matrix drive is not limited to that described in the above-described embodiments, and, if necessary, a capacitor device or a transistor may be further included. In this case, a necessary drive circuit may be included in addition to the above-described signal line drive circuit 120 and the above-described scanning line drive circuit 130 according to a modification of the pixel drive circuit.

It is to be noted that the present disclosure is allowed to have following configurations.

(1) An organic EL display unit including:
a first organic EL device and a second organic EL device, the first organic EL device including a first light-emitting layer that emits first color light, and the second organic EL device including a second light-emitting layer that emits second color light of a shorter wavelength than the first color light,
in which the first light-emitting layer includes, as a host material, a polymer material that does not emit the first color light or does not mainly emit the first color light, and includes, as a dopant, a low-molecular-weight material or a polymer material that emits the first color light.

(2) The organic EL display unit according to (1), in which the polymer material is a material that emits the second color light.

(3) The organic EL display unit according to (2), in which
the first light-emitting layer is a red light-emitting layer that emits red light as the first color light, and
the second light-emitting layer is a green light-emitting layer that emits green light as the second color light.

(4) The organic EL display unit according to (3), further including a third organic EL device including a blue light-emitting layer that emits blue light,
in which the red light-emitting layer and the green light-emitting layer are provided for respective devices, and
the blue light-emitting layer is provided as a common layer for the first organic EL device, the second organic EL device, and the third organic EL device.

(5) The organic EL display unit according to (4), in which a connection layer having a hole transport property is provided between the red light-emitting layer and the blue light-emitting layer and between the green light-emitting layer and the blue light-emitting layer.

(6) The organic EL display unit according to (2), in which
the first light-emitting layer is a red light-emitting layer that emits red light as the first color light, and
the second light-emitting layer is a blue light-emitting layer that emits blue light as the second color light.

(7) The organic EL display unit according to (2), in which
the first light-emitting layer is a green light-emitting layer that emits green light as the first color light, and
the second light-emitting layer is a blue light-emitting layer that emits blue light as the second color light.

(8) The organic EL display unit according to (2), in which the first light-emitting layer is a yellow light-emitting layer that emits yellow light as the first color light.

(9) The organic EL display unit according to any one of (1) to (8), in which the polymer material is a dendrimer or a polymer.

(10) The organic EL display unit according to any one of (1) to (9), in which the second light-emitting layer includes the low-molecular-weight material as the dopant of the first light-emitting layer near an interface with one of other layers above and below the second light-emitting layer.

(11) The organic EL display unit according to any one of (1) to (10), in which the polymer material is a thickener.

(12) A method of manufacturing an organic EL display unit, the organic EL display unit including a first organic EL device and a second organic EL device, the first organic EL device including a first light-emitting layer that emits first color light, and the second organic EL device including a second light-emitting layer that emits second color light of a shorter wavelength than the first color light, the method including:

forming the first light-emitting layer using a polymer material as a host material and a low-molecular-weight material or a polymer material as a dopant, the polymer material that does not emit the first color light or does not mainly emit the first color light, and the low-molecular-weight material or the polymer material that emits the first color light.

(13) The method of manufacturing the organic EL display unit according to (12), in which the first light-emitting layer and the second light-emitting layer are formed by reverse offset printing.

(14) The method of manufacturing the organic EL display unit according to (13), in which the polymer material is a material that emits the second color light.

(15) The method of manufacturing the organic EL display unit according to (14), in which the first light-emitting layer is a red light-emitting layer that emits red light as the first color light, and the second light-emitting layer is a green light-emitting layer that emits green light as the second color light.

(16) The method of manufacturing the organic EL display unit according to (15) further including a step of forming, by an evaporation method, a blue light-emitting layer configured to emit blue light after the red light-emitting layer and the green light-emitting layer are formed.

(17) The method of manufacturing the organic EL display unit according to any one of (12) to (16), in which the polymer material is a thickener.

(18) An ink used to form a first light-emitting layer of an organic EL display unit, the organic EL display unit including a first organic EL device and a second organic EL device, the first organic EL device including the first light-emitting layer that emits first color light, and the second organic EL device including a second light-emitting layer that emits second color light of a shorter wavelength than the first color light, the ink including:

a polymer material that does not emit the first color light or does not mainly emit the first color light as a host material and a low-molecular-weight material or a polymer material that emits the first color light as a dopant.

(19) An electronic apparatus provided with an organic EL display unit, the organic EL display unit including:

a first organic EL device and a second organic EL device, the first organic EL device including a first light-emitting layer that emits first color light, and the second organic EL device including a second light-emitting layer that emits second color light of a shorter wavelength than the first color light, in which the first light-emitting layer includes, as a host material, a polymer material that does not emit the first color light or does not mainly emit the first color light, and includes, as a dopant, a low-molecular-weight material or a polymer material that emits the first color light.

The present application claims priority on the basis of Japanese Patent Application No. 2012-225750 filed in the Japan Patent Office on Oct. 11, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An organic EL display unit comprising:

a first organic EL device and a second organic EL device, the first organic EL device including a first light-emitting layer that emits first color light, and the second organic EL device including a second light-emitting layer that emits second color light of a shorter wavelength than the first color light, wherein the first light-emitting layer includes, as a host material, a first polymer material that does not emit the first color light or does not mainly emit the first color light, and includes, as a dopant, a low-molecular-weight material that emits the first color light, and wherein the second light-emitting layer includes the low-molecular-weight material as the dopant of the first light-emitting layer near an interface with one of other layers above and below the second light-emitting layer.

2. The organic EL display unit according to claim 1, wherein the first polymer material is a material that emits the second color light.

3. The organic EL display unit according to claim 2, wherein the first light-emitting layer is a red light-emitting layer that emits red light as the first color light, and the second light-emitting layer is a green light-emitting layer that emits green light as the second color light.

4. The organic EL display unit according to claim 3, further comprising a third organic EL device including a blue light-emitting layer that emits blue light, wherein the red light-emitting layer and the green light-emitting layer are provided for respective devices, and the blue light-emitting layer is provided as a common layer for the first organic EL device, the second organic EL device, and the third organic EL device.

5. The organic EL display unit according to claim 4, wherein a connection layer having a hole transport property is provided between the red light-emitting layer and the blue light-emitting layer and between the green light-emitting layer and the blue light-emitting layer.

6. The organic EL display unit according to claim 2, wherein the first light-emitting layer is a red light-emitting layer that emits red light as the first color light, and the second light-emitting layer is a blue light-emitting layer that emits blue light as the second color light.

7. The organic EL display unit according to claim 2, wherein the first light-emitting layer is a green light-emitting layer that emits green light as the first color light, and the second light-emitting layer is a blue light-emitting layer that emits blue light as the second color light.

8. The organic EL display unit according to claim 2, wherein the first light-emitting layer is a yellow light-emitting layer that emits yellow light as the first color light.

9. The organic EL display unit according to claim 1, wherein the first polymer material is a dendrimer or a polymer.

10. The organic EL display unit according to claim 1, wherein the first polymer material is a thickener.

11. An electronic apparatus provided with an organic EL display unit, the organic EL display unit comprising:

a first organic EL device and a second organic EL device, the first organic EL device including a first light-emitting layer that emits first color light, and the second organic EL device including a second light-emitting layer that emits second color light of a shorter wavelength than the first color light, wherein the first light-emitting layer includes, as a host material, a first polymer material that does not emit the first color light or does not mainly emit the first color light, and includes, as a dopant, a low-molecular-weight material that emits the first color light, and wherein the second light-emitting layer includes the low-molecular-weight material as the dopant of the first light-emitting layer near an interface with one of other layers above and below the second light-emitting layer.

12. An organic EL display unit comprising:

a first organic EL device including a first light-emitting layer that emits red light; and a second organic EL device including a second light-emitting layer that emits green light, wherein the first light-emitting layer includes, as a host material, a first polymer material that emits green light, and includes, as a dopant, a second polymer material that emits red light, and wherein the second light-emitting layer includes the second polymer material as the dopant of the first light-emitting layer near an interface with one of other layers above and below the second light-emitting layer.

* * * * *

UNITED STATES PATENT AND TRADEMARK OFFICE
CERTIFICATE OF CORRECTION

PATENT NO. : 9,755,149 B2  
APPLICATION NO. : 14/431984  
DATED : September 5, 2017  
INVENTOR(S) : Toshiaki Imai et al.

Page 1 of 1

It is certified that error appears in the above-identified patent and that said Letters Patent is hereby corrected as shown below:

On the Title Page

Item (56) at Other Publications:  
Please replace "Mar. 14, 2017" with -- September 13, 2016 --

Signed and Sealed this  
Thirty-first Day of October, 2017

Joseph Matal  
*Performing the Functions and Duties of the*  
*Under Secretary of Commerce for Intellectual Property and*  
*Director of the United States Patent and Trademark Office*